US012757419B2

(12) United States Patent
Otsuka

(10) Patent No.: US 12,757,419 B2
(45) Date of Patent: Oct. 6, 2026

(54) SCHOTTKY BARRIER DIODE

(71) Applicants: TAMURA CORPORATION, Tokyo (JP); Novel Crystal Technology, Inc., Sayama (JP)

(72) Inventor: Fumio Otsuka, Sayama (JP)

(73) Assignees: Tamura Corporation, Tokyo (JP); Novel Crystal Technology, Inc., Saitama (JP)

( * ) Notice: Subject to any disclaimer, the term of this patent is extended or adjusted under 35 U.S.C. 154(b) by 407 days.

(21) Appl. No.: 18/361,317

(22) Filed: Jul. 28, 2023

(65) Prior Publication Data

US 2024/0105859 A1 Mar. 28, 2024

(30) Foreign Application Priority Data

Sep. 26, 2022 (JP) ................................ 2022-153043

(51) Int. Cl.
*H10D 8/60* (2025.01)
*H10D 62/10* (2025.01)
*H10D 62/85* (2025.01)

(52) U.S. Cl.
CPC ........... *H10D 8/605* (2025.01); *H10D 62/106* (2025.01); *H10D 62/85* (2025.01)

(58) Field of Classification Search
CPC ...... H10D 8/605; H10D 62/106; H10D 62/85; H10D 62/126; H10D 8/60; H10D 62/107;
(Continued)

(56) References Cited

U.S. PATENT DOCUMENTS 8,927,401 B2 * 1/2015 Chao .................... H10D 64/117 438/576
9,478,673 B2 10/2016 Aketa et al.
(Continued)

FOREIGN PATENT DOCUMENTS

JP 2014-116471 A 6/2014
JP 2018-142655 A 9/2018
(Continued)

OTHER PUBLICATIONS

Partial European Search Report dated Feb. 29, 2024 from related EP 23 18 7310.0.
(Continued)

*Primary Examiner* — Steven B Gauthier
*Assistant Examiner* — Khatib A Rahman
(74) *Attorney, Agent, or Firm* — Scully, Scott, Murphy & Presser, P.C.

(57) ABSTRACT

A Schottky barrier diode includes a semiconductor layer of a first conductivity type including a wide-bandgap semiconductor and a trench defining a mesa portion on a first surface thereof, a high-resistance region under the trench of the semiconductor layer, the high-resistance region including an impurity of a second conductivity type different from the first conductivity type, an insulating film or a semiconductor film of the second conductivity type, the insulating film or semiconductor film covering at least a bottom surface among inner surfaces of the trench, an anode electrode on the semiconductor layer through the insulating film or the semiconductor film, the anode electrode being connected to the mesa portion, and a cathode electrode directly or through another layer on a second surface of the semiconductor layer on the opposite side to the first surface.

6 Claims, 15 Drawing Sheets

(58) Field of Classification Search
CPC ...... H10D 62/117; H10D 62/80; H10D 99/00; H01L 21/425
See application file for complete search history.

(56) References Cited

U.S. PATENT DOCUMENTS

| | | | | |
|---|---|---|---|---|
| 11,043,602 | B2 | 6/2021 | Sasaki et al. | |
| 11,563,092 | B2 | 1/2023 | Higashiwaki et al. | |
| 2015/0333190 | A1 | 11/2015 | Aketa et al. | |
| 2019/0363197 | A1 | 11/2019 | Sasaki et al. | |
| 2020/0144377 | A1 | 5/2020 | Higashiwaki et al. | |
| 2020/0161445 | A1* | 5/2020 | Miyamoto | H10D 62/8325 |
| 2020/0235234 | A1* | 7/2020 | Sasaki | H10D 62/117 |
| 2021/0343879 | A1 | 11/2021 | Arima et al. | |
| 2021/0384362 | A1* | 12/2021 | Li | H10D 62/60 |
| 2022/0149174 | A1* | 5/2022 | Sawada | H10D 62/8325 |

FOREIGN PATENT DOCUMENTS

| | | | |
|---|---|---|---|
| JP | 2018-186246 | A | 11/2018 |
| JP | 2022-002333 | A | 1/2022 |
| JP | 2022-61884 | A | 4/2022 |
| WO | 2020/121507 | A1 | 6/2020 |
| WO | 2020/203650 | A1 | 10/2020 |

OTHER PUBLICATIONS

Extended European Search Report dated Jun. 11, 2024 from counterpart EP 23 18 7310.0.

Notice of Reasons for Refusal dated Jun. 2, 2026 received in counterpart Japanese patent application 2022-153043 together with English language translation.

Notice of Reasons for Refusal dated Aug. 18, 2026 received in counterpart Japanese patent application 2022-153043 together with English language translation.

* cited by examiner

SCHOTTKY BARRIER DIODE

CROSS-REFERENCE TO RELATED APPLICATIONS

The present patent application claims the priority of Japanese patent application No. 2022/153043 filed on Sep. 26, 2022, and the entire contents of Japanese patent application No. 2022/153043 are hereby incorporated by reference.

TECHNICAL FIELD

The present invention relates to a Schottky barrier diode.

BACKGROUND ART

A Schottky barrier diode is known which is provided with a trench MOS structure and a semiconductor layer formed of a $Ga_2O_3$-based semiconductor as a wide-bandgap semiconductor (see Patent Literature 1).

The Schottky barrier diode described in Patent Literature 1 has a high-withstand voltage and low-loss characteristics because of using the semiconductor layer formed of the $Ga_2O_3$-based semiconductor as the wide-bandgap semiconductor, and, in addition, it can have a higher withstand voltage because of having the trench MOS structure without increasing the resistance of the semiconductor layer.

CITATION LIST

Patent Literature

Patent Literature 1: JP 2022-61884 A

SUMMARY OF INVENTION

It is an object of the invention to provide a Schottky bather diode with a trench structure that has an even higher withstand voltage than the known art.

An aspect of the invention provides a Schottky barrier diode defined in (1) to (7) below.

(1) A Schottky barrier diode, comprising

- a semiconductor layer of a first conductivity type comprising a wide-bandgap semiconductor and a trench defining a mesa portion on a first surface thereof;
- a high-resistance region under the trench of the semiconductor layer, the high-resistance region comprising an impurity of a second conductivity type different from the first conductivity type;
- an insulating film or a semiconductor film of the second conductivity type, the insulating film or semiconductor film covering at least a bottom surface among inner surfaces of the trench;
- an anode electrode on the semiconductor layer through the insulating film or the semiconductor film, the anode electrode being connected to the mesa portion; and
- a cathode electrode directly or through another layer on a second surface of the semiconductor layer on the opposite side to the first surface.

(2) The Schottky barrier diode defined in (1), wherein a relationship $W \times N_d < D \times N_a$ is satisfied, where W is a width of a depletion layer formed in the semiconductor layer from the bottom surface of the trench in a depth direction when a reverse voltage is applied, $N_d$ is a donor concentration in the high-resistance region, D is a depth of the high-resistance region from the bottom surface of the trench, and $N_a$ is an acceptor concentration in the high-resistance region.

(3) The Schottky barrier diode defined in (1) or (2), wherein the wide-bandgap semiconductor comprises a gallium oxide-based semiconductor, and wherein the first conductivity type and the second conductivity type are n-type and p-type, respectively.

(4) The Schottky barrier diode defined in (3), wherein the impurity of the second conductivity type comprises nitrogen.

(5) The Schottky barrier diode defined in (1) or (2), wherein the trench defines an annular protrusion surrounding a periphery of the mesa portion, and wherein an annular guard ring of the second conductivity type is provided on the protrusion.

(6) The Schottky barrier diode defined in (4), wherein a plane orientation of a principal surface of the semiconductor layer is (001), wherein the mesa portion comprises a line-shaped planar pattern with a length direction along [010], and wherein a surface of a side portion of the mesa portion comprises the impurity of the second conductivity type.

(7) The Schottky barrier diode defined in (6), wherein the mesa portion does not comprise an intentionally doped impurity of the first conductivity type.

Herein, "impurity of first (or second) conductivity type" is intended to mean an impurity that can provide a semiconductor of the first (or second) conductivity type when a pure semiconductor is doped with the impurity.

Advantageous Effects of Invention

According to the invention, it is possible to provide a Schottky bather diode with a trench structure that has an even higher withstand voltage than those of the known art.

DESCRIPTION OF EMBODIMENTS

First Embodiment (Configuration of a Schottky Barrier Diode)

Figure 1A:
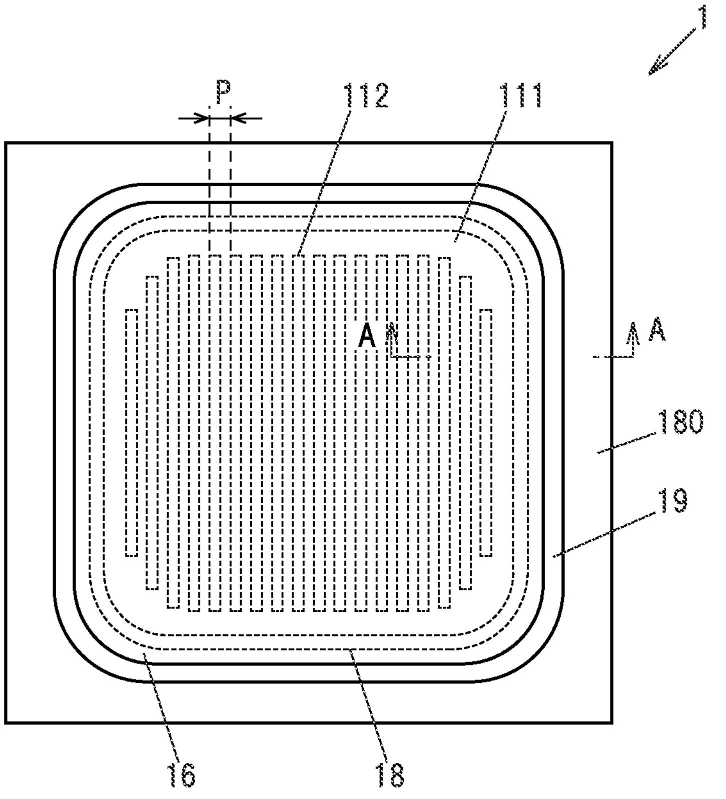
FIG. 1A is a top view showing a Schottky bather diode in the first embodiment of the present invention.
Figure 1B:
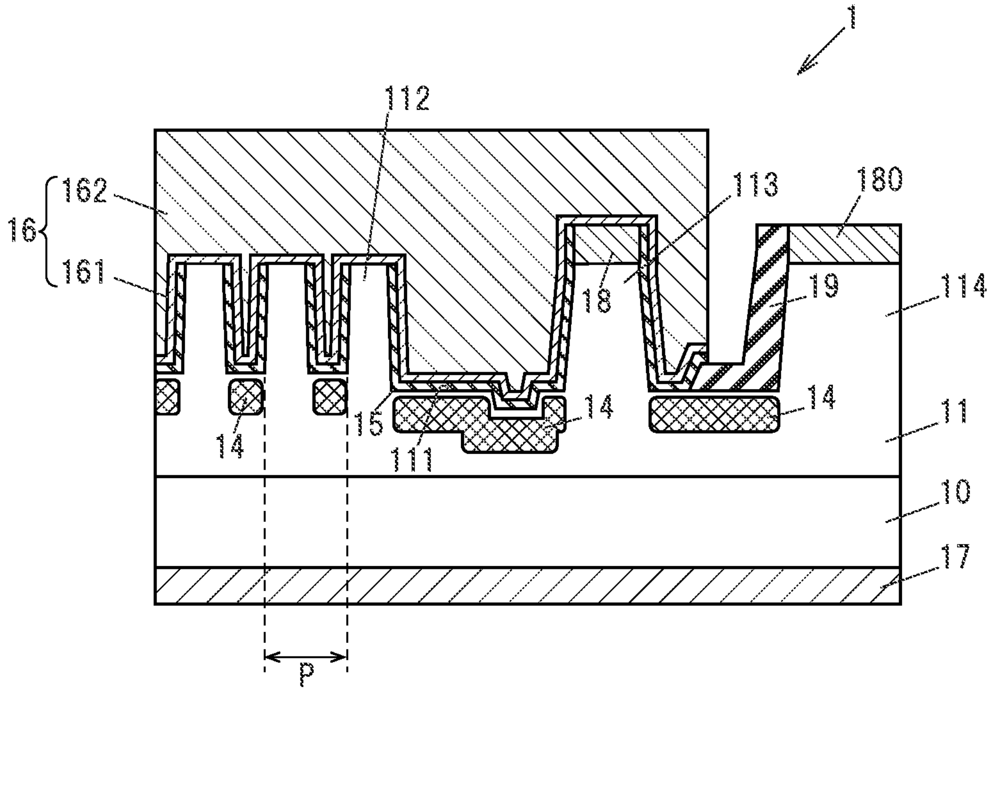
FIG. 1B is a vertical cross-sectional view showing the Schottky barrier diode taken along a line A-A shown in FIG. 1A.

FIG. 1A is a top view showing a Schottky barrier diode 1 in the first embodiment of the invention. FIG. 1B is a vertical cross-sectional view showing the Schottky barrier diode 1 taken along the line A-A shown in FIG. 1A. The Schottky barrier diode 1 is a vertical Schottky barrier diode that has a trench MOS structure.

In FIG. 1A, the outlines of mesa portions 112 and a guard ring 18 of a semiconductor layer 11, which are located under an anode electrode 16, are indicated by broken lines, and the positions of a trench 111, the mesa portions 112 and the guard ring 18 of the semiconductor layer 11, which are located under the anode electrode 16, are indicated by their reference signs.

The Schottky barrier diode 1 includes the n-type semiconductor layer 11 formed of a gallium oxide-based semiconductor and having the trench 111 defining the mesa portions 112 on an upper surface, a high-resistance region 14 that is provided under the trench 111 of the semiconductor layer 11 and contains a p-type impurity, an insulating film 15 that is provided so as to cover at least a bottom surface among inner surfaces of the trench 111, the anode electrode 16 that is provided on the semiconductor layer 11 through the insulating film 15 and connected to the mesa portions 112, and a cathode electrode 17 provided directly or through another layer on a lower surface of the semiconductor layer 11. Herein, "p-type (or n-type) impurity" is intended to mean an impurity that can provide a semiconductor of p- (or n-) conductivity type when a pure semiconductor is doped with the impurity.

The "upper surface" of the semiconductor layer 11 is one of principal surfaces of the semiconductor layer 11 and is a surface on the upper side in FIG. 1B. The "lower surface" of the semiconductor layer 11 is the other of the principal surfaces of the semiconductor layer 11 and is a surface opposite to the "upper surface".

The Schottky barrier diode 1 preferably includes the guard ring 18 to increase resistance to surge currents, as shown in FIGS. 1A and 1B. In this case, the trench 111 defines an annular protrusion 113 surrounding a periphery of the mesa portions 112 and the annular guard ring 18 is formed on the protrusion 113. The guard ring 18 is formed of a p-type semiconductor, e.g., an oxide of nickel such as NiO, or an oxide of copper such as $Cu_2O$ or CuO.

In FIG. 1A, the outlines of the mesa portions 112 and the guard ring 18 of the semiconductor layer 11, which are located under the anode electrode 16, are indicated by broken lines, and the positions of the trench 111, the mesa portions 112 and the guard ring 18 of the semiconductor layer 11, which are located under the anode electrode 16, are indicated by their reference signs.

The mesa portion 112 of the semiconductor layer 11 and the anode electrode 16 form a Schottky junction, and the Schottky barrier diode 1 uses the rectifying properties of this Schottky junction. In the Schottky barrier diode 1, a potential barrier at an interface between the anode electrode 16 and the semiconductor layer 11 as viewed from the semiconductor layer 11 is lowered by applying forward voltage between the anode electrode 16 and the cathode electrode 17 (positive potential on the anode electrode 16 side), allowing a current to flow from the anode electrode 16 to the cathode electrode 17.

On the other hand, when reverse voltage is applied between the anode electrode 16 and the cathode electrode 17 (negative potential on the anode electrode 16 side), the current does not flow due to the Schottky barrier. At this time, since depletion layers spread toward the inside of the mesa portions 112 from the interfaces between the anode electrode 16 and the mesa portions 112 and between the insulating film 15 and the mesa portions 112 and close channels, leakage current is efficiently suppressed.

Typically, the Schottky barrier diode 1 includes an n-type semiconductor substrate 10 as a base for epitaxial growth of the semiconductor layer 11, and the lower surface of the semiconductor layer 11 is in contact with the semiconductor substrate 10, as shown in FIG. 1B. In this case, the cathode electrode 17 is provided on a surface of the semiconductor substrate 10 opposite to the semiconductor layer 11. In other wards, the cathode electrode 17 is provided on the lower surface of the semiconductor layer 11 through the semiconductor substrate 10.

The semiconductor substrate 10 is formed of a single crystal of an n-type gallium oxide-based semiconductor containing a group IV element such as Si or Sn as a donor. A donor concentration in the semiconductor substrate 10 is, e.g., not less than $1.0\times10^{16}$ $cm^{-3}$ and not more than $1.0\times10^{19}$ $cm^{-3}$. A thickness of the semiconductor substrate 10 is, e.g., not less than 400 μm and not more than 700 μm.

The semiconductor layer 11 is formed of a single crystal of an n-type gallium oxide-based semiconductor containing a group IV element such as Si or Sn as a donor. A donor concentration in the semiconductor layer 11 is lower than the donor concentration in the semiconductor substrate 10 and is, e.g., not less than $1.0\times10^{16}$ $cm^{-3}$ and not more than $5.0\times10^{16}$ $cm^{-3}$. A thickness of the semiconductor layer 11 is, e.g., not less than 5 μm and not more than 15 μm. The semiconductor layer 11 is composed of, e.g., an epitaxial film epitaxially grown on the semiconductor substrate 10.

The gallium oxide-based semiconductor is $Ga_2O_3$ or is $Ga_2O_3$ doped with one or both of Al and In, and has a composition represented by $(Ga_xAl_yIn_{(1-x-y)})_2O_3$ ($0<x\leq1$, $0\leq y<1$, $0<x+y\leq1$). $Ga_2O_3$ has a wider band gap when doped with Al and a narrower band gap when doped with In. The single crystal of the gallium oxide-based semiconductor mentioned above typically has a β-crystal structure. For example, $Ga_2O_3$, which is a typical example of gallium oxide-based semiconductor, has a bandgap energy of 4.5 to 4.9 eV and a breakdown field strength of about 8.0 MV/cm.

When the thickness of the semiconductor layer 11 is designed so that an electric field, which is generated in each part when a reverse voltage equal to the design withstand voltage is applied to the Schottky barrier diode 1, is smaller than the breakdown field, the deeper the trench 111, the lower the electric field at the Schottky interfaces between the anode electrode 16 and the mesa portions 112 when reverse voltage is applied. However, if the trench 111 is too deep, electrical resistance between the anode electrode 16 and the cathode electrode 17 of the Schottky barrier diode 1 increases. Thus, the depth of the trench 111 is set to, e.g., not less than 1 μm and not more than 3 μm.

The narrower the width of the trench 111, the lower the conduction loss but the more difficult it is to manufacture, hence, the width of the trench 111 is set to, e.g., not less than 0.5 μm and not more than 2.0 μm. The narrower the width of the mesa portion 112, the lower the electric field strength in the mesa portion 112 but the more difficult it is to manufacture, hence, the width of the mesa portion 112 is set to, e.g., not less than 0.5 μm and not more than 2.0 μm.

The planar pattern of the mesa portions 112 is, e.g., a lines-and-spaces pattern as shown in FIG. 1A. In this case, a pitch width P of the mesa portions 112 is set to, e.g., 2 to 5 μm.

The field strength in the Schottky barrier diode 1 is affected by the width of the mesa portions 112 and the depth of the trench 111, etc., described above but is hardly affected by the planar patterns of the trench 111 and the mesa portions 112. Thus, the planar patterns of the trench 111 and the mesa portions 112 on the semiconductor layer 11 are not specifically limited.

The high-resistance region 14 is a region whose resistance is increased by implanting a p-type impurity such as nitrogen (N) that forms a deep acceptor level in the gallium oxide-based semiconductor. The high-resistance region 14 acts as an electric field relaxation layer and can improve withstand voltage of the Schottky barrier diode 1.

A depth of the high-resistance region 14 is, e.g., not less than 0.1 μm and not more than 0.5 μm, and a p-type impurity concentration, i.e., an acceptor concentration, in the high-resistance region 14 is, e.g., not less than $5.0\times10^{17}$ $cm^{-3}$ and not more than $5.0\times10^{18}$ $cm^{-3}$. To effectively exert the electric field relaxation effect of the high-resistance region 14, it is preferable to satisfy a relationship $W\times N_d<D\times N_a$, where W is a width of a depletion layer formed in the semiconductor layer 11 from the bottom surface of the trench 111 in the depth direction when a reverse voltage is applied, $N_d$ is a donor concentration in the high-resistance region 14, D is a depth of the high-resistance region 14 from the bottom surface of the trench 111, and $N_a$ is an acceptor concentration in the high-resistance region 14.

The insulating film 15 is preferably provided so as to cover not only the bottom surface among the inner surfaces (i.e., bottom and side surfaces) of the trench 111 but also side surfaces (which are shared by the trenches 111) of the mesa portions 112, as shown in FIG. 1B. By coveting the side surfaces of the mesa portions 112 with the insulating film 15, the mesa portions 112 are easily depleted when reverse voltage is applied to the Schottky barrier diode 1, hence, the electric field in the mesa portions 112 is relaxed more effectively, leakage current is reduced and the withstand voltage of the Schottky barrier diode 1 is improved. In this regard, when the insulating film 15 covers the side surfaces of the mesa portions 112, the side surfaces do not need to be entirely covered and, e.g., portions on the upper side of the mesa portions 112 may not be covered.

The insulating film 15 is, e.g., a $SiO_2$ film or a stacked film in which an $Al_2O_3$ film is stacked on a $SiO_2$ film. When the insulating film 15 is a stacked film in which an $Al_2O_3$ film is stacked on a $SiO_2$ film, e.g., a thickness of the $SiO_2$ film is not less than 50 nm and not more than 200 nm and a thickness of the $Al_2O_3$ film is not less than 10 nm and not more than 30 nm.

The anode electrode 16 is in contact with the insulating film 15 and the mesa portions 112 exposed from the insulating film 15. The anode electrode 16 typically includes a film-shaped first layer 161 coveting the insulating film 15 and the upper portions of the mesa portions 112 exposed from the insulating film 15, and a second layer 162 on the first layer 161, as shown in FIG. 1B. For example, the first layer 161 is formed of a metal film with a work function of not less than 4.8 eV, such as a Ni film, a Mo film, a Pt film, an Au film, or a stacked film composed of not less than two of these films, and the second layer 162 is formed of a low-resistance metal film such as an Au film or an Al film. A thickness of the first layer 161 is, e.g., not less than 50 nm and not more than 500 nm, and a thickness of the second layer 162 is, e.g., not less than 0.5 μm and not more than 3 μm. In addition, a layer formed of Ti, etc., may be provided as a barrier metal between the first layer 161 and the second layer 162.

To relax electric field concentration at an end portion of the anode electrode 16 in a planar direction, the anode electrode 16 is preferably arranged such that the end portion in the planar direction overlies a field insulating film 19. In this case, the field insulating film 19 is provided so as to cover the bottom surface of the trench 111 in the vicinity a terminal end portion thereof. The field insulating film 19 is, e.g., a silicon oxide film. A thickness of the field insulating film 19 is, e.g., not less than 400 nm and not more than 2000 nm.

The anode electrode 16 is in ohmic contact with the guard ring 18 and forms a built-in p-n diode with the semiconductor layer 11. Thus, when a surge current flows through the Schottky barrier diode 1, part of the surge current can flow through the built-in p-n diode and thermal destruction of the Schottky barrier diode 1 due to the surge current can be prevented.

When the Schottky barrier diode 1 includes semiconductor substrate 10, the cathode electrode 17 is in ohmic contact with the semiconductor substrate 10. When the Schottky barrier diode 1 does ml include the semiconductor substrate 10 and the cathode electrode 17 is directly connected to the semiconductor layer 11, the cathode electrode 17 is in ohmic contact with the semiconductor layer 11. The cathode electrode 17 has, e.g., a stacked structure in which an Au film is stacked on a Ti film. In this case, a film formed of Ni or Mo, etc., may be provided as a barrier metal between the Ti film and the Au film.

(Method for Manufacturing the Schottky Barrier Diode)

An example of a method for manufacturing the Schottky barrier diode 1 will be described below.

FIGS. 2A to 2C, 3A to 3C, 4A to 4C and 5A to 5C are explanatory vertical cross-sectional views showing a process of manufacturing the Schottky barrier diode 1 in the first embodiment of the invention. The semiconductor substrate 10 is not shown in the drawings.

Figure 2A:
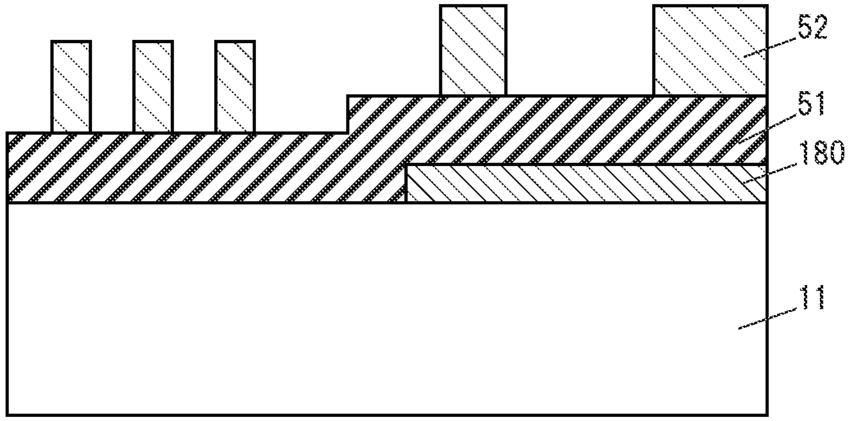
FIGS. 2A to 2C are explanatory vertical cross-sectional views showing a process of manufacturing the Schottky barrier diode in the first embodiment of the invention.

Firstly, as shown in FIG. 2A, a NiO film 180 and a $SiO_2$ film 51 are formed on the semiconductor layer 11 formed on the semiconductor substrate 10, and a pattern of a photoresist 52 is formed thereon.

The NiO film 180 is formed to a thickness of not less than 50 nm and not more than 200 nm by sputtering and is then processed into the pattern shown in FIG. 2A by lithography and thy etching. A gas used for dry etching of the NiO film 180 is a $Cl_2$ gas or a $BCl_3$ gas. The $SiO_2$ film 51 is formed to a thickness of not less than 100 nm and not more than 2000 nm by sputtering. The photoresist 52 is processed into patterns of the mesa portion 112 and the guard ring 18 by lithography.

Figure 2B:
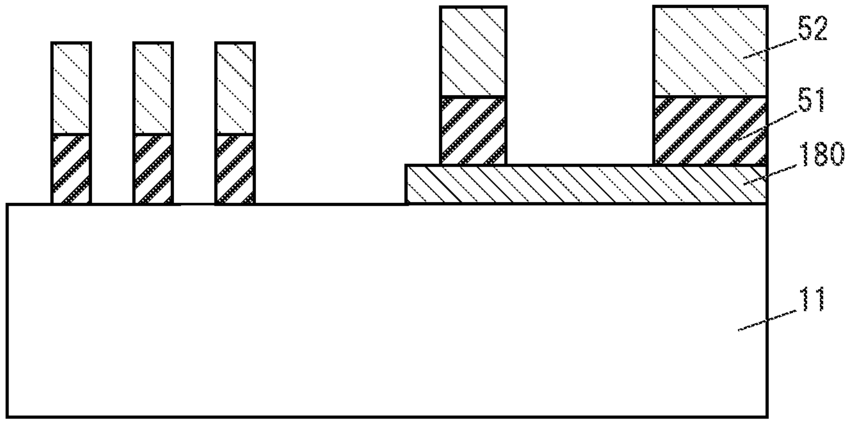

Next, as shown in FIG. 2B, the $SiO_2$ film 51 is dry etched using the photoresist 52 as a mask. A gas used for this dry etching is a $NF_3$ gas, a $CF_4$ gas, a $C_4F_8$ gas, or a $CHF_3$ gas.

Figure 2C:
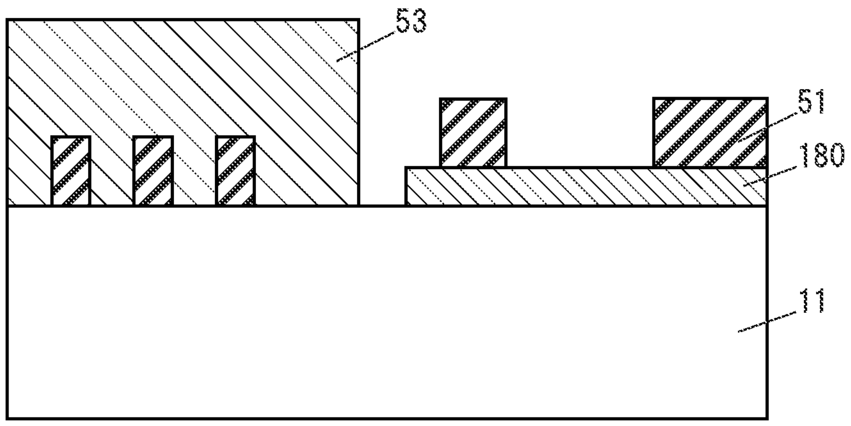

Next, as shown in FIG. 2C, after removing the photoresist 52, a photoresist 53 is formed so as to cover the $SiO_2$ film 51 to which the pattern of the mesa portions 112 has been transferred.

Figure 3A:
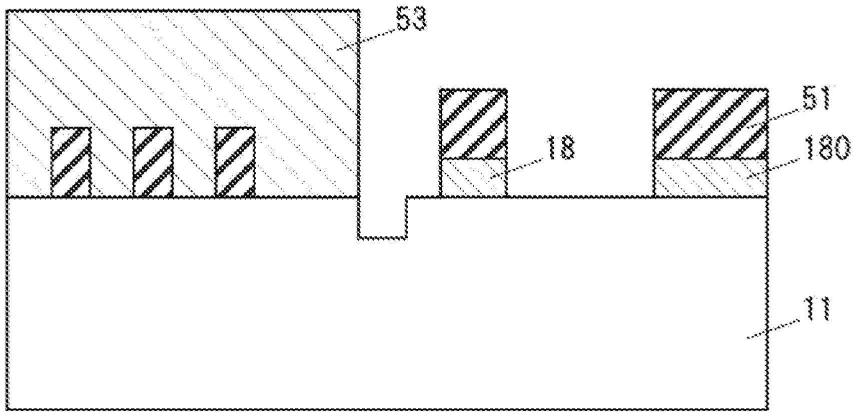
FIGS. 3A to 3C are explanatory vertical cross-sectional views showing the process of manufacturing the Schottky barrier diode in the first embodiment of the invention.

Next, as shown in FIG. 3A, the NiO film 180 is dry etched using the $SiO_2$ film 51 as a mask. By this etching, a portion of the NiO film 180 to which the pattern of the guard ring 18 has been transferred becomes the guard ring 18. Since the semiconductor layer 11 formed of a gallium oxide-based semiconductor is also etched by the chlorine-based etching gas used in this dry etching, a sub-trench is formed at an edge of the pattern of the NiO film 180, but a depth of the sub-trench can be suppressed to not more than 0.1 μm by optimizing the etching time.

Figure 3B:
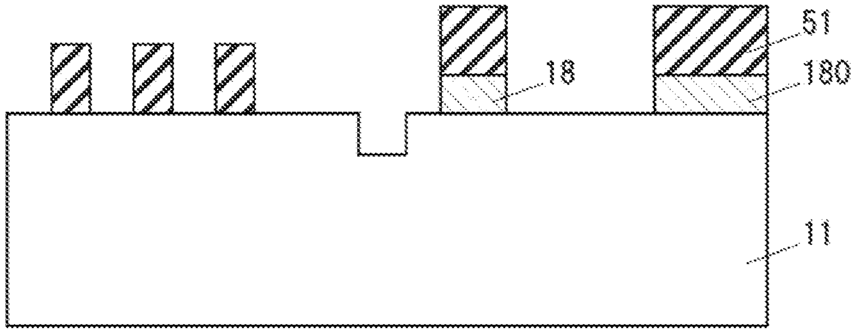

Next, as shown in FIG. 3B, the photoresist 53 is removed.

Figure 3C:
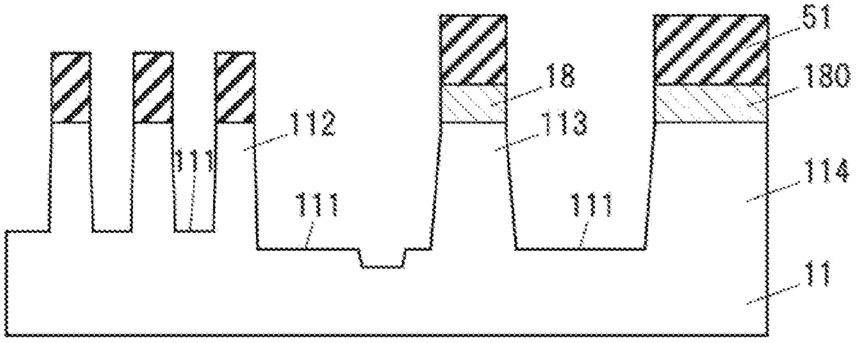

Next, as shown in FIG. 3C, the trench 111 is formed on the semiconductor layer 11 by dry etching using the $SiO_2$ film 51 as a mask. The depth of the trench 111 is not less than 1 μm and not more than 3 μm. A gas used for this dry etching is a $Cl_2$ gas or a $BCl_3$ gas.

Figure 4A:
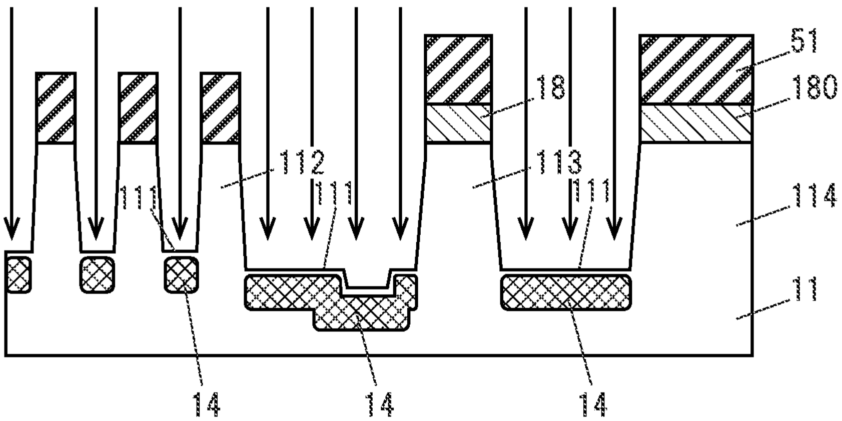
FIGS. 4A to 4C are explanatory vertical cross-sectional views showing the process of manufacturing the Schottky barrier diode in the first embodiment of the invention.

Next, as shown in FIG. 4A, the high-resistance region 14 is formed under the trench 111 (below the bottom surface of the trench 111) by implanting nitrogen ions from above into the entire surface of the wafer and then performing annealing. A dose of nitrogen ion implantation is not less than $5.0\times10^{12}$ $cm^{-2}$ and not more than $5.0\times10^{13}$ $cm^{-2}$ and implantation energy is not less than 50 keV and not more than 350 keV. In this case, an implantation depth is not less than 0.1 μm and not more than 0.5 μm, and a nitrogen concentration is not less than $5.0\times10^{17}$ $cm^{-3}$ and not more than $5.0\times10^{18}$ $cm^{-3}$. The annealing is performed at a temperature of not less than 900° C. and not more than 1100° C. in a nitrogen atmosphere or an oxygen atmosphere.

Figure 4B:
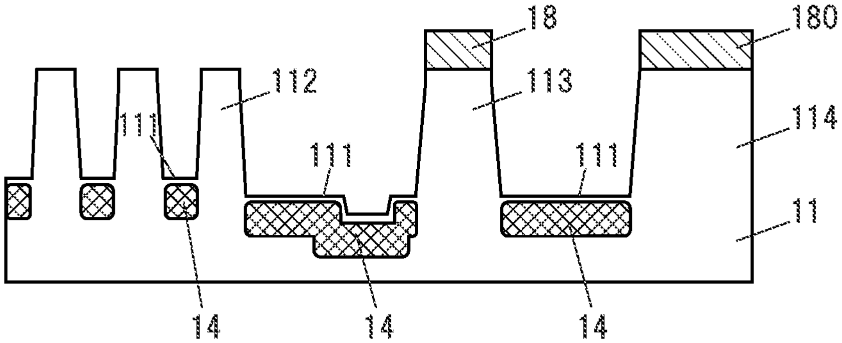

Next, as shown in FIG. 4B, the $SiO_2$ film 51 is removed using buffered hydrofluoric acid.

Figure 4C:
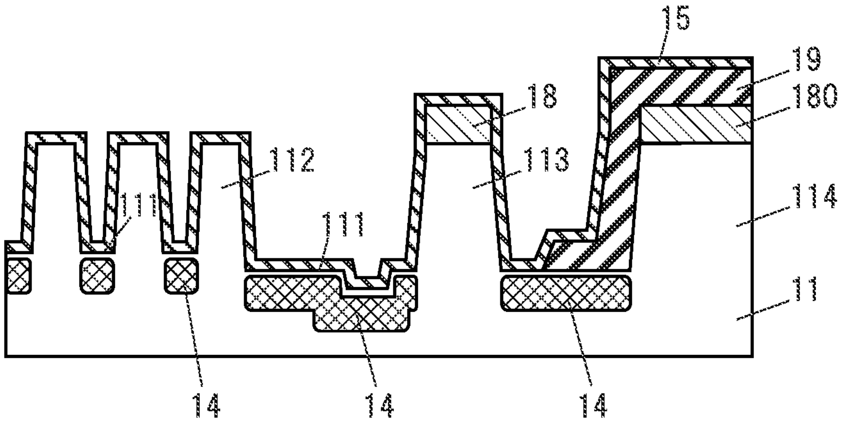

Next, as shown in FIG. 4C, a TEOS (tetraethoxysilane) film as the field insulating film 19 and a TEOS film as the insulating film 15 are formed. The field insulating film 19 is formed to a thickness of not less than 400 nm and not more than 2000 nm by CVD (Chemical Vapor Deposition) and is then processed into the pattern shown in FIG. 4C by lithography and etching. The field insulating film 19 is formed so as to cover side and upper surfaces of a portion 114 of the semiconductor layer 11 on the outer side of the trench and the bottom surface of the trench 111 in the vicinity of the portion 114.

The insulating film 15 is formed to a thickness of not less than 50 nm and not more than 200 nm by CVD. An $Al_2O_3$ film may additionally be formed to a thickness of not less than 10 nm and not more than 30 nm on the TEOS film by ALD (Atomic Layer Deposition) so that the stacked film composed of the TEOS film and the $Al_2O_3$ film is provided as the insulating film 15. In this case, the $Al_2O_3$ film acts as an etching stopper film in an etch-back step described next.

Figure 5A:
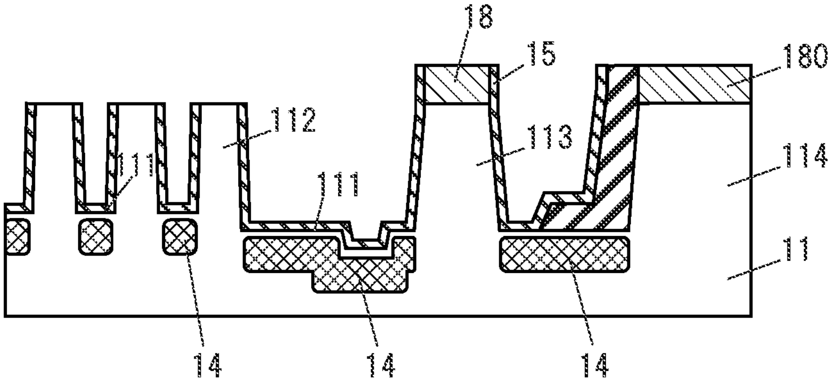
FIGS. 5A to 5C are explanatory vertical cross-sectional views showing the process of manufacturing the Schottky barrier diode in the first embodiment of the invention.

Next, as shown in FIG. 5A, the insulating film 15 on the mesa portions 112 and the guard ring 18 is removed. Removal of the insulating film 15 on the mesa portions 112 and the guard ring 18 is performed by resist etch-back where a resist with a thickness of not less than 2 μm and not more than 3 μm is applied to the entire surface of the wafer and etching is then performed on the entire surface.

The resist etch-back is performed by, e.g., fluorine-based dry etching using a fluorine-based etching gas such as $CF_4$ gas, and the etching is finished when the resist on the mesa portions 112 and the guard ring 18 is etched. When the insulating film 15 is a single layer of TEOS film, the insulating film 15 on the mesa portions 112 and the guard ring 18 is also etched at this time. When the insulating film 15 is a stacked film composed of a TEOS film and an $Al_2O_3$ film, the $Al_2O_3$ film acts as an etching stopper, hence, e.g., the $Al_2O_3$ film is etched with an alkaline solution such as TMAH (tetramethylammonium hydroxide) solution and the TEOS film thereunder is etched with a chemical solution containing fluorine, such as hydrofluoric acid. After removing the insulating film 15 on the mesa portions 112 and the guard ring 18, the remaining resist is removed. After that, heat treatment at a temperature of not less than 400° C. and not more than 500° C. is performed as annealing for etching damage recovery.

Figure 5B:
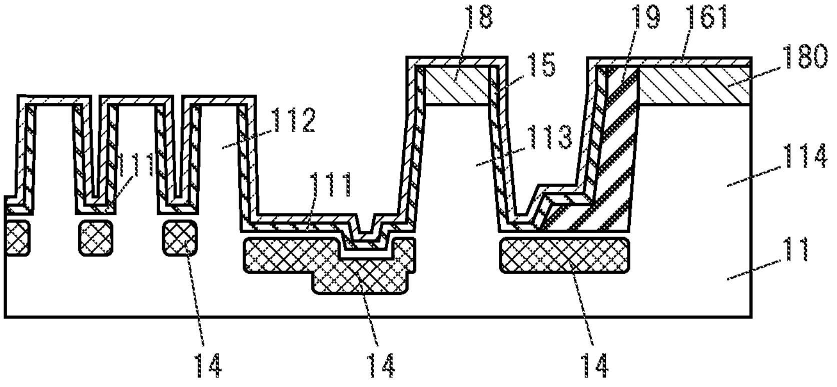

Next, after cleaning the wafer with a mixture solution of pure water, hydrogen peroxide and sulfuric acid, a stacked film composed of a Mo film, a Ni film and an Au film, etc., is formed to a thickness of not less than 50 nm and not more than 500 nm as the first layer 161 of the anode electrode 16 by vapor deposition, as shown in FIG. 5B.

Figure 5C:
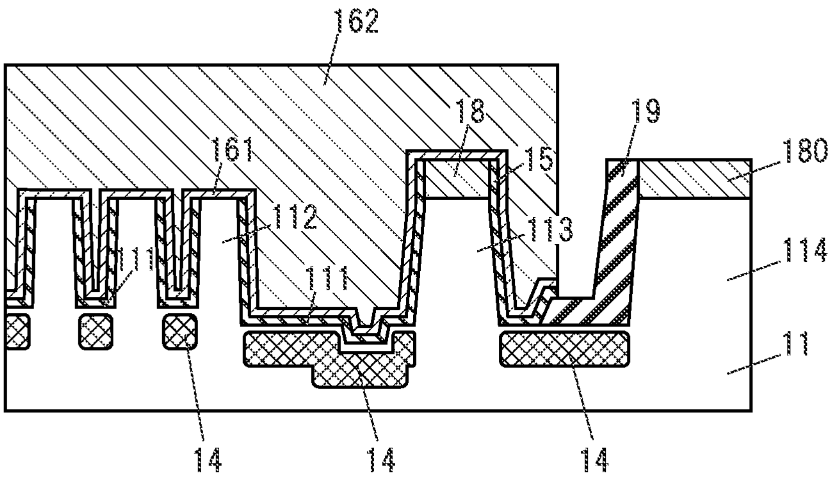

Next, as shown in FIG. 5C, the second layer 162 composed of an Al film is formed on the first layer 161. The Al film is formed to a thickness of not less than 0.5 μm and not more than 3 μm by sputtering. Before forming the Al film, a Ti film may be formed as an adhesion layer by sputtering. The Al film may be formed at a high temperature of 300 to 450° C. so that the Al film is completely embedded in regions of the trench 111 between the mesa portions 112. After that, the first layer 161 and the second layer 162 are processed into the pattern shown in FIG. 5C by lithography and etching.

Subsequently, after protecting the wafer front surface with a resist, the TEOS film formed on the wafer back surface, i.e., the lower surface of the semiconductor substrate 10, is removed using, e.g., a chemical solution containing fluorine, such as hydrofluoric acid. Then, after removing the resist, a stacked film composed of a Ti film and an Au film is formed as the cathode electrode 17 on the lower surface of the semiconductor substrate 10. A Ni film or a Mo film may be provided as a barrier metal between the Ti film and the Au film. When a stacked film composed of a TEOS film and an $Al_2O_3$ film is used as the insulating film 15, the insulating film removal step before forming the cathode electrode 17 can be omitted since the insulating film formed on the wafer back surface has already been removed by wet etching in the resist etch-back step described above.

Figure 6A:
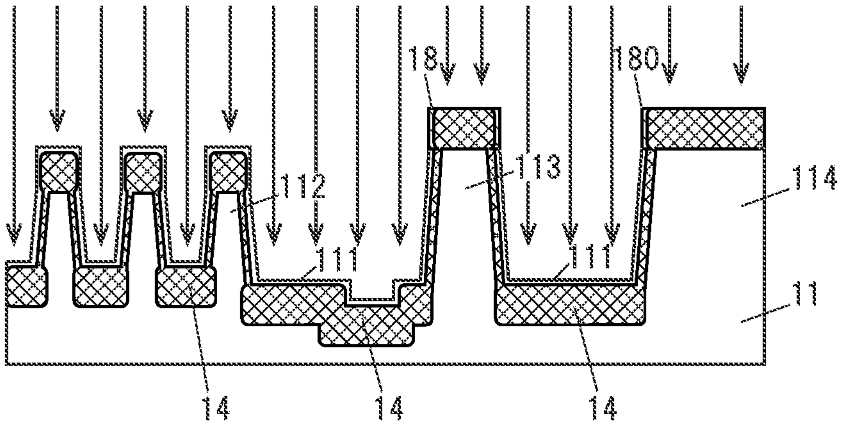
FIGS. 6A to 6C are explanatory vertical cross-sectional views showing a modification of the process of manufacturing the Schottky barrier diode in the first embodiment of the invention.
Figure 6B:
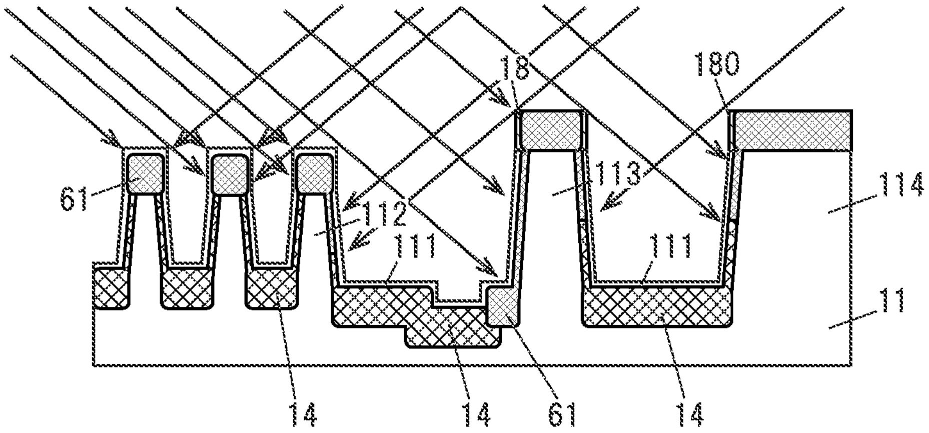
Figure 6C:
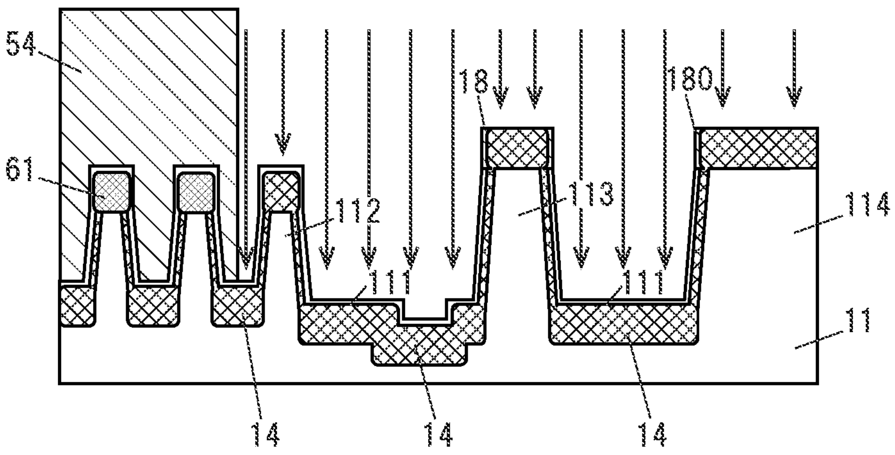

FIGS. 6A to 6C are explanatory vertical cross-sectional views showing a modification of the process of manufacturing the Schottky barrier diode 1 in the first embodiment of the invention.

In this modification, firstly, the steps up to the formation of the trench 111 shown in FIG. 3C are performed in the same manner as in the manufacturing method described above.

Next, as shown in FIG. 6A, after removing the 5102 film 51 using a buffered hydrofluoric acid solution, nitrogen ions are implanted from above into the entire surface of the wafer and annealing is then performed. The high-resistance region 14 is thereby formed in the whole region of the wafer front surface including the portion under the trench 111 and the upper and side portions of the mesa portions 112. A dose of nitrogen ion implantation is not less than $5.0\times10^{12}$ $cm^{-2}$ and not more than $5.0\times10^{13}$ $cm^{-2}$ and implantation energy is not less than 50 keV and not more than 350 keV. The annealing is performed at a temperature of not less than 900° C. and not more than 1100° C. in a nitrogen atmosphere or an oxygen atmosphere.

Next, as shown in FIG. 6B, Si ions as an n-type impurity are implanted from diagonally above into the entire surface of the wafer and annealing is then performed. At this time, in n-type impurity-implanted regions 61 into which Si is implanted, such as the upper portions of the mesa portions 112, nitrogen which is a p-type impurity implanted in the previous step is canceled out by Si which is an n-type impurity. On the other hand, under the trench 111, etc. where the diagonally implanted Si ions do not reach by being shielded by the mesa portions 112 and the protrusion 113, nitrogen is not canceled out. An angle of Si ion implantation is, e.g., 45°. A dose of Si ion implantation is not less than $5.0\times10^{12}$ $cm^{-2}$ and not more than $5.0\times10^{13}$ $cm^{-2}$ and implantation energy is not less than 100 keV and not more than 200 keV. The annealing is performed at a temperature of not less than 600° C. and not more than 1100° C. in a nitrogen atmosphere. Alternatively, an n-type impurity such as Sn may be implanted in place of Si.

Next, as shown in FIG. 6C, after the mesa portions 112 excluding those on the outer side is covered with a resist 54, nitrogen ion implantation is performed again on the wafer from above, thereby implanting nitrogen into a terminal end region of the Schottky barrier diode 1, including the outer mesa portions 112 and the portion under the trench 111, etc., not covered with the resist 54. It is thereby possible to lower the electric field in the terminal end region of the Schottky barrier diode 1 and improve reverse withstand voltage. A dose of nitrogen ion implantation is not less than $5.0\times10^{12}$ $cm^{-2}$ and not more than $5.0\times10^{13}$ $cm^{-2}$ and implantation energy is not less than 50 keV and not more than 350 keV. The annealing is performed at a temperature of not less than 900° C. and not more than 1100° C. in a nitrogen atmosphere or an oxygen atmosphere. The reason why nitrogen is implanted without coveting the outer mesa portions 112 with the resist 54 is to cancel out Si which is implanted into the portion under the trench 111 outside the mesa portions 112 without being shielded by the mesa portions 112 and the protrusion 113.

After that, the resist 54 is removed, and the step of forming the field insulating film 19 and the insulating film 15 shown in FIG. 4C and the steps thereafter are performed in the same manner as in the manufacturing method described above.

By removing the $SiO_2$ film 51 after forming the trench 111 as in this modification, ion implantation can be performed after removing the dry etch residues with a buffered hydrofluoric acid solution. This prevents variations in the characteristics of the Schottky barrier diode 1 caused by etch residues that are hardened by ion implantation and cannot be removed.

Second Embodiment

The second embodiment of the invention differs from the first embodiment mainly in that the Schottky barrier diode does not have a guard ring. Hereinafter, descriptions of the same features as in the first embodiment will be omitted or simplified.

(Configuration of the Schottky Barrier Diode)

Figure 7A:
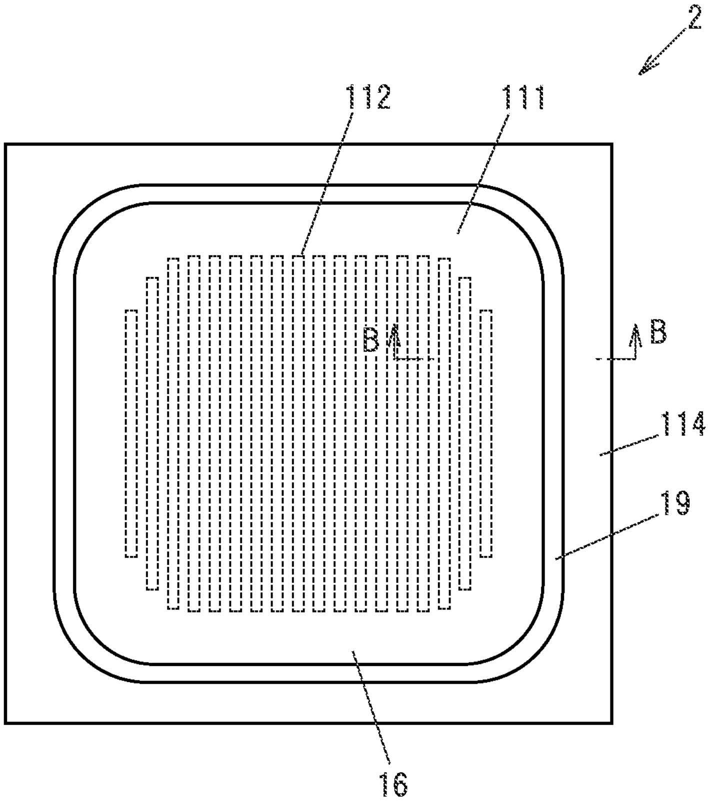
FIG. 7A is a top view showing a Schottky barrier diode in the second embodiment of the invention.
Figure 7B:
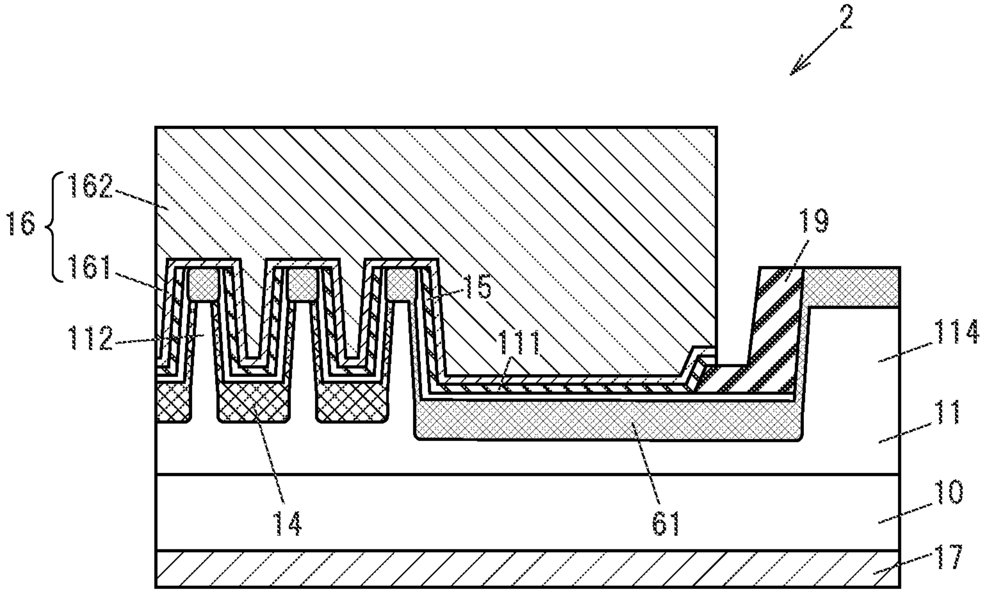
FIG. 7B is a vertical cross-sectional view showing the Schottky barrier diode taken along a line B-B shown in FIG. 7A.

FIG. 7A is a top view showing a Schottky barrier diode 2 in the second embodiment of the invention. FIG. 7B is a vertical crow-sectional view showing the Schottky barrier diode 2 taken along the line B-B shown in FIG. 7A. The Schottky barrier diode 2 is a vertical Schottky barrier diode that has a trench MOS structure.

In FIG. 7A, the outlines of the mesa portions 112 of the semiconductor layer 11, which are located under the anode electrode 16, are indicated by broken lines, and the positions of the trench 111 and the mesa portions 112 of the semiconductor layer 11, which are located under the anode electrode 16, are indicated by their reference signs.

The Schottky barrier diode 2 includes the n-type semiconductor layer 11 formed of a gallium oxide-based semiconductor and having the trench 111 defining the mesa portions 112 on the upper surface, the high-resistance region 14 that is provided under the trench 111 of the semiconductor layer 11 and contains a p-type impurity, the insulating film 15 that is provided so as to cover at least the bottom surface among the inner surfaces of the trench 111, the anode electrode 16 that is provided on the semiconductor layer 11 through the insulating film 15 and connected to the mesa portions 112, and the cathode electrode 17 provided directly or through another layer on the lower surface of the semiconductor layer 11, in the same manner as the Schottky barrier diode 1 in the first embodiment.

The Schottky barrier diode 2 does not include the guard ring 18 and the annular protrusion 113 surrounding the mesa portions 112. In addition, in the example shown in FIG. 7B, the n-type impurity-implanted regions 61 into which an n-type impurity such as Si is implanted are provided in the upper portions of the mesa portions 112, etc. The n-type impurity-implanted region 61 will be described in an example of the manufacturing method below (Method for Manufacturing the Schottky Barrier Diode)

An example of a method for manufacturing the Schottky barrier diode 2 will be described below.

FIGS. 8A to 8C, 9A to 9C and 10A to 10C are explanatory vertical cross-sectional views showing a process of manufacturing the Schottky barrier diode 2 in the second embodiment of the invention. The semiconductor substrate 10 is not shown in the drawings.

Figure 8A:
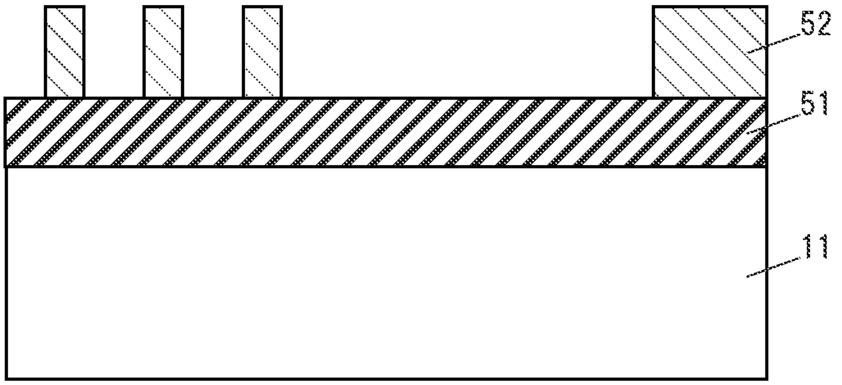
FIGS. 8A to 8C are explanatory vertical cross-sectional views showing a process of manufacturing the Schottky barrier diode in the second embodiment of the invention.

Firstly, as shown in FIG. 8A, the $SiO_2$ film 51 is formed on the semiconductor layer 11 formed on the semiconductor substrate 10, and a pattern of the photoresist 52 is formed thereon.

The $SiO_2$ film 51 is formed to a thickness of not less than 100 nm and not more than 2000 nm by sputtering. The photoresist 52 is processed into the pattern of the mesa portions 112 by lithography.

Figure 8B:
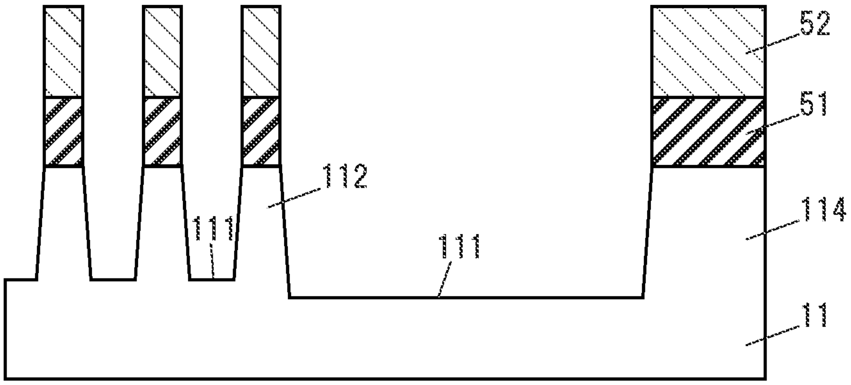

Next, as shown in FIG. 8B, the $SiO_2$ film 51 is dry etched using the photoresist 52 as a mask, and the trench 111 is formed on the semiconductor layer 11 by further dry etching using the photoresist 52 and the $SiO_2$ film 51 as masks.

A gas used for etching of the $SiO_2$ film 51 is a $NF_3$ gas, a $CF_4$ gas, a $C_4F_8$ gas, or a $CHF_3$ gas. A gas used for etching of the semiconductor layer 11 is a $Cl_2$ gas or a $BCl_3$ gas. The depth of the trench 111 is not less than 1 μm and not more than 3 μm.

Figure 8C:
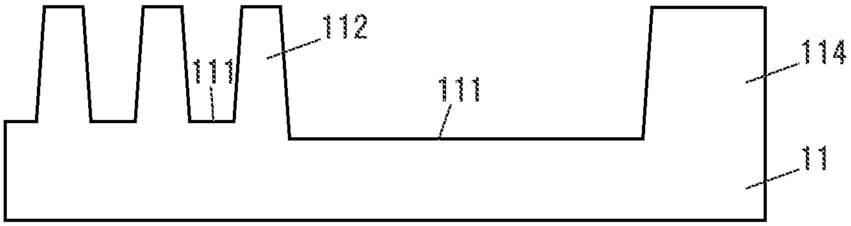

Next, as shown in FIG. 8C, the photoresist 52 is removed and the $SiO_2$ film 51 is removed with a buffered hydrofluoric acid solution.

Figure 9A:
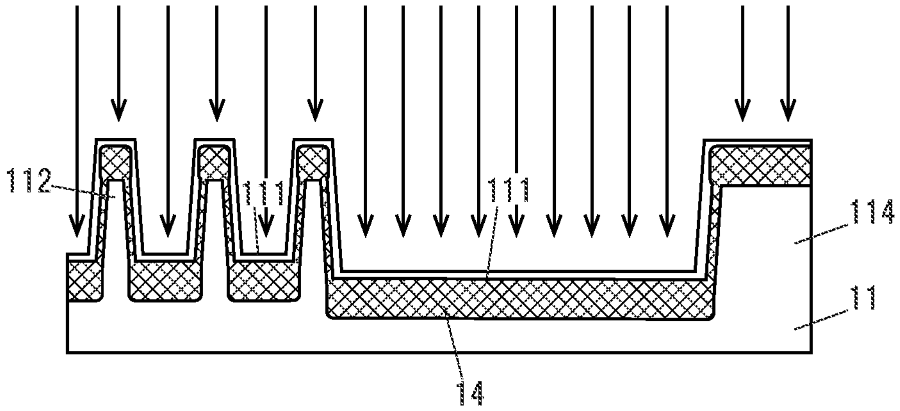
FIGS. 9A to 9C are explanatory vertical cross-sectional views showing the process of manufacturing the Schottky barrier diode in the second embodiment of the invention.

Next, as shown in FIG. 9A, the high-resistance region 14 is formed under the trench 111 (below the bottom surface of the trench 111) by implanting nitrogen ions from above into the entire surface of the wafer and then performing annealing. A dose of nitrogen ion implantation is not less than $5.0\times10^{12}$ cm$^{-2}$ and not more than $5.0\times10^{13}$ cm$^{-2}$ and implantation energy is not less than 50 keV and not more than 350 keV. In this case, an implantation depth is not less than 0.1 μm and not more than 0.5 μm, and a nitrogen concentration is not less than $5.0\times10^{17}$ cm$^{-3}$ and not more than $5.0\times10^{18}$ cm$^{-3}$. The annealing is performed at a temperature of not less than 900° C. and not more than 1100° C. in a nitrogen atmosphere or an oxygen atmosphere.

Figure 9B:
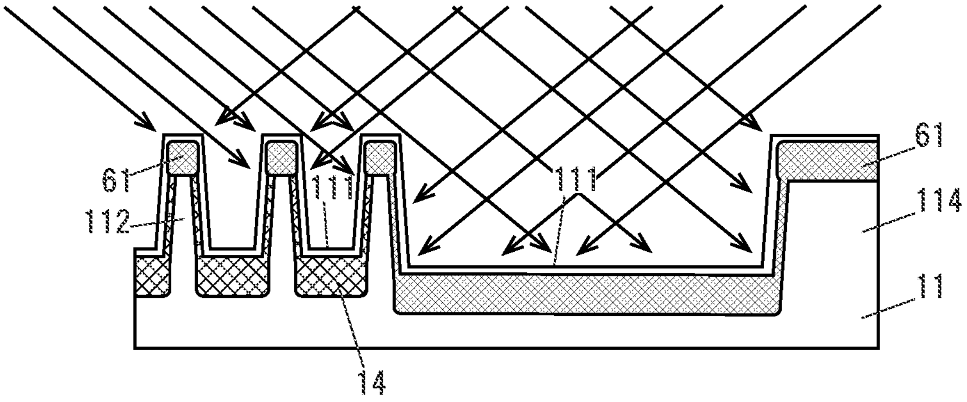

Next, as shown in FIG. 9B, Si ions as an n-type impurity are implanted from diagonally above into the entire surface of the wafer and annealing is then performed. At this time, in the n-type impurity-implanted regions 61 into which Si is implanted, such as the upper portions of the mesa portions 112, nitrogen which is a p-type impurity implanted in the previous step is canceled out by Si which is an n-type impurity. On the other hand, under the trench 111, etc., where the diagonally implanted Si ions do not reach by being shielded by the mesa portions 112, nitrogen is not canceled out. An angle of Si ion implantation is, e.g., 45°. A dose of Si ion implantation is not less than $5.0\times10^{12}$ cm$^{-2}$ and not more than $5.0\times10^{13}$ cm$^{-2}$ and implantation energy is not less than 100 keV and not more than 200 keV. The annealing is performed at a temperature of not less than 600° C. and not more than 1100° C. in a nitrogen atmosphere. Alternatively, an n-type impurity such as Sn may be implanted in place of Si.

Figure 9C:
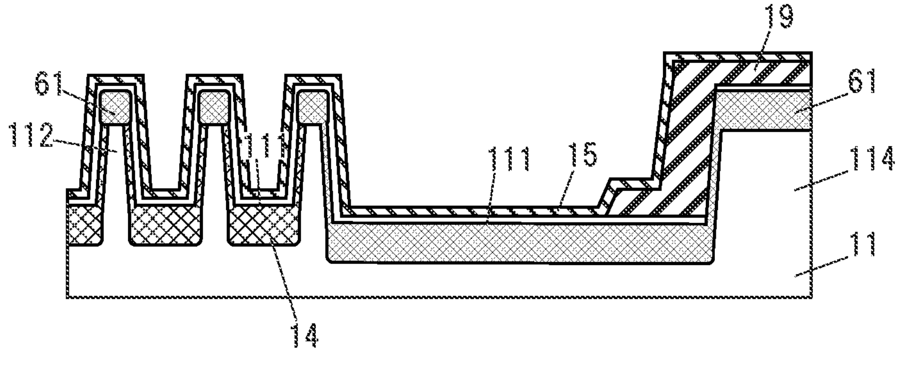

Next, as shown in FIG. 9C, a TEOS film as the field insulating film 19 and a TEOS film as the insulating film 15 are formed. The field insulating film 19 is formed to a thickness of not less than 400 nm and not more than 2000 nm by CVD and is then processed into the pattern shown in FIG. 9C by lithography and etching. The field insulating film 19 is formed so as to cover the side and upper surfaces of the portion 114 of the semiconductor layer 11 on the outer side of the trench and the bottom surface of the trench 111 in the vicinity of the portion 114.

The insulating film 15 is formed to a thickness of not less than 50 nm and not more than 200 nm by CVD. An $Al_2O_3$ film may additionally be formed to a thickness of not less than 10 nm and not more than 30 nm on the TEOS film by ALD so that the stacked film composed of the TEOS film and the $Al_2O_3$ film is provided as the insulating film 15. In this case, the $Al_2O_3$ film acts as an etching stopper film in an etch-back step described next.

Figure 10A:
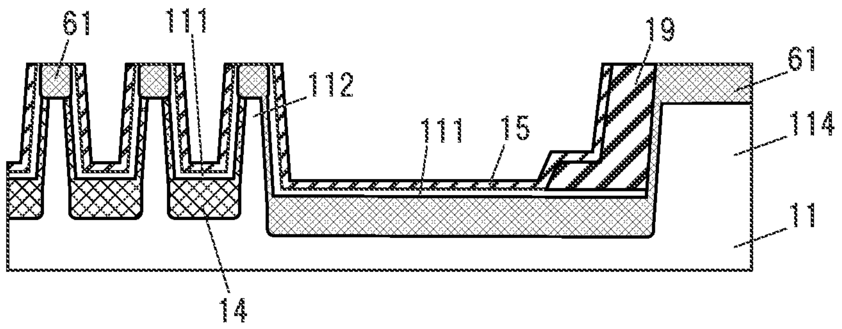
FIGS. 10A to 10C are explanatory vertical cross-sectional views showing the process of manufacturing the Schottky barrier diode in the second embodiment of the invention.

Next, as shown in FIG. 10A, the insulating film 15 on the mesa portions 112 is removed. Removal of the insulating film 15 on the mesa portions 112 is performed by resist etch-back where a resist with a thickness of not less than 2 μm and not more than 3 μm is applied to the entire surface of the wafer and etching is then performed on the entire surface.

The resist etch-back is performed by, e.g., fluorine-based dry etching using a fluorine-based etching gas such as $CF_4$ gas, and the etching is finished when the resist on the mesa portions 112 is etched. When the insulating film 15 is a single layer of TEOS film, the insulating film 15 on the mesa portions 112 is also etched at this time. When the insulating film 15 is a stacked film composed of a TEOS film and an $Al_2O_3$ film, the $Al_2O_3$ film acts as an etching stopper, hence, e.g., the $Al_2O_3$ film is etched with an alkaline solution such as TMAH solution and the TEOS film thereunder is etched with a chemical solution containing fluorine, such as hydrofluoric acid. After removing the insulating film 15 on the mesa portions 112, the remaining resist is removed. After that, heat treatment at a temperature of not less than 400° C. and not more than 500° C. is performed as annealing for etching damage recovery.

Figure 10B:
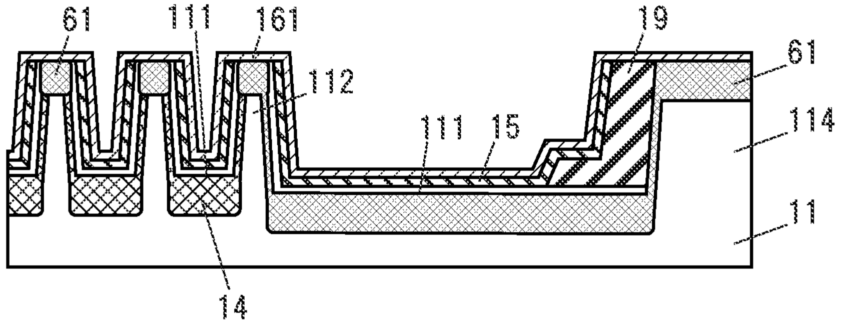

Next, after cleaning the wafer with a mixture solution of pure water, hydrogen peroxide and sulfuric acid, a stacked film composed of a Mo film, a Ni film and an Au film, etc., is formed to a thickness of not less than 50 nm and not more than 500 nm as the first layer 161 of the anode electrode 16 by vapor deposition, as shown in FIG. 10B.

Figure 10C:
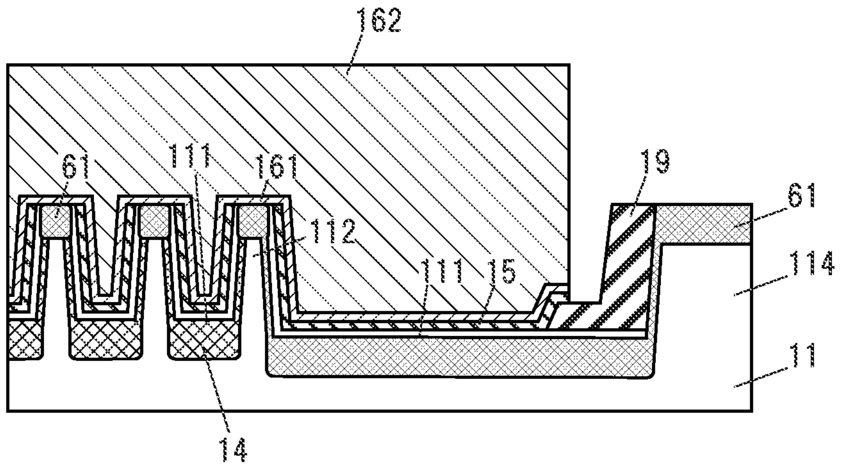

Next, as shown in FIG. 10C, the second layer 162 composed of an Al film is formed on the first layer 161. The Al film is formed to a thickness of not less than 0.5 μm and not more than 3 μm by sputtering. Before forming the Al film, a Ti film may be formed as an adhesion layer by sputtering. The Al film may be formed at a high temperature of 300 to 450° C. so that the Al film is completely embedded in the regions of the trench 111 between the mesa portions 112. After that, the first layer 161 and the second layer 162 are processed into the pattern shown in FIG. 10C by lithography and etching.

Subsequently, after protecting the wafer front surface with a resist, the TEOS film formed on the wafer back surface, i.e., the lower surface of the semiconductor substrate 10, is removed using, e.g., a chemical solution containing fluorine, such as hydrofluoric acid. Then, after removing the resist, a stacked film composed of a Ti film and an Au film is formed as the cathode electrode 17 on the lower surface of the semiconductor substrate 10. A Ni film or a Mo film may be provided as a barrier metal between the Ti film and the Au film. When a stacked film composed of a TEOS film and an $Al_2O_3$ film is used as the insulating film 15, the insulating film removal step before forming the cathode electrode 17 can be omitted since the insulating film formed on the wafer back surface has already been removed by wet etching in the resist etch-back step described above.

Figure 11:
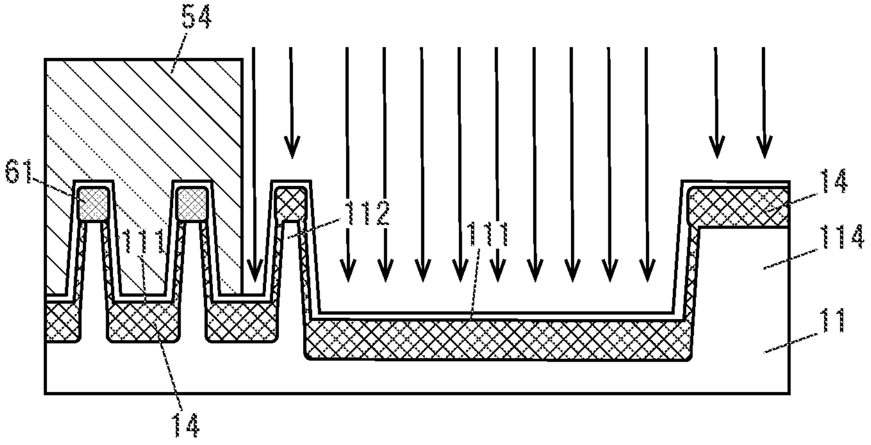
FIG. 11 is an explanatory vertical cross-sectional view showing a modification of the process of manufacturing the Schottky barrier diode in the second embodiment of the invention.

FIG. 11 is an explanatory vertical cross-sectional view showing a modification of the process of manufacturing the Schottky barrier diode 2 in the second embodiment of the invention.

In this modification, firstly, the steps up to the Si ion implantation shown in FIG. 9B are performed in the same manner as in the manufacturing method described above.

Next, as shown in FIG. 11, after the mesa portions 112 excluding those on the outer side is covered with the resist 54, nitrogen ion implantation is performed again on the wafer from above, thereby implanting nitrogen into a terminal end region of the Schottky barrier diode 2, including the outer mesa portions 112 and the portion under the trench 111, etc., not covered with the resist 54. It is thereby possible to lower the electric field in the terminal end region of the Schottky barrier diode 2 and improve reverse withstand voltage. A dose of nitrogen ion implantation is not less than $5.0\times10^{12}$ cm$^{-2}$ and not more than $5.0\times10^{13}$ cm$^{-2}$ and implantation energy is not less than 50 keV and not more than 350 keV. The annealing is performed at a temperature of not less than 900° C. and not more than 1100° C. in a nitrogen atmosphere or an oxygen atmosphere.

After that, the resist 54 is removed, and the step of forming the field insulating film 19 and the insulating film 15 shown in FIG. 9C and the steps thereafter are performed in the same manner as in the manufacturing method described above.

The present inventors found that when a plane orientation of a principal surface of the semiconductor layer 11 is (001) and the length direction of the line-shaped planar pattern of the mesa portions 112 is [010] (the width direction is [100]), nitrogen implanted into the mesa portions 112 in the step shown in FIG. 9A effectively diffuses to surfaces of the side portions, resulting in a significant decrease in the nitrogen concentration inside the mesa portions 112. It is considered that this is because nitrogen tends to diffuse in the [100] direction which is the width direction of the mesa portion 112. In this case, it is possible to suppress an increase in on-resistance of the Schottky barrier diode 2 due to implantation of nitrogen into the mesa portions 112.

Third Embodiment

The third embodiment of the invention differs from the second embodiment mainly in that Si, which is an n-type impurity, is not implanted into the semiconductor layer. Hereinafter, descriptions of the same features as in the first and second embodiments will be omitted or simplified.

(Configuration of the Schottky Barrier Diode)

Figure 12A:
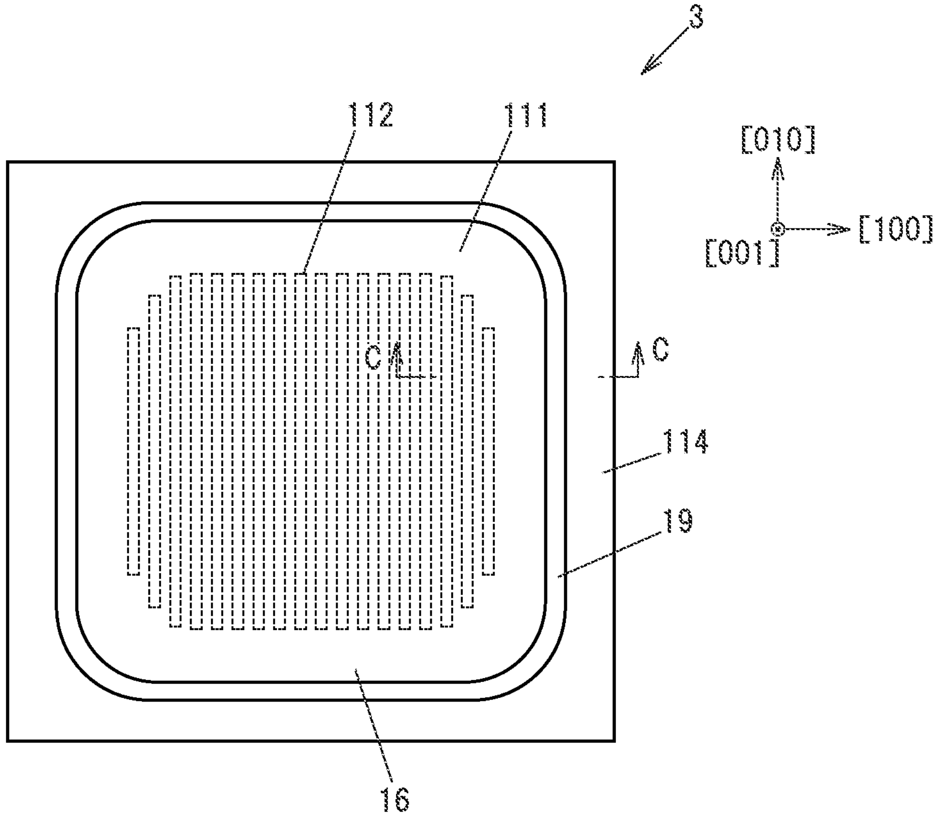
FIG. 12A is a top view showing a Schottky barrier diode in the third embodiment of the invention.
Figure 12B:
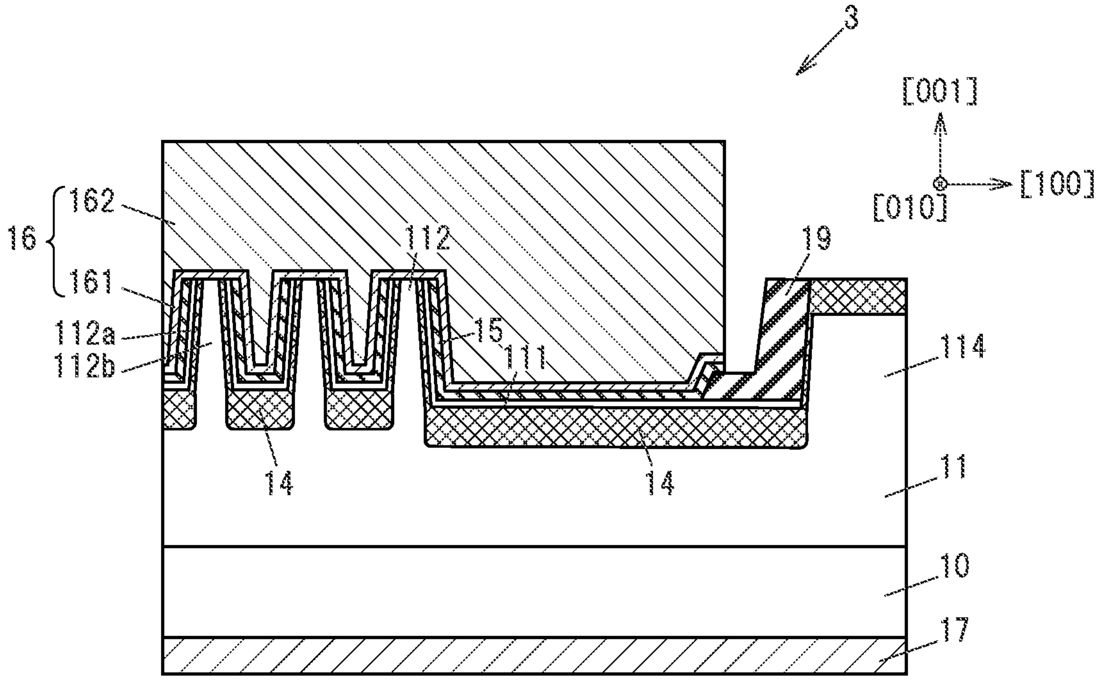
FIG. 12B is a vertical cross-sectional view showing the Schottky barrier diode taken along a line C-C shown in FIG. 12A.

FIG. 12A is a top view showing a Schottky barrier diode 3 in the third embodiment of the invention. FIG. 12B is a vertical cross-sectional view showing the Schottky barrier diode 3 taken along the line C-C shown in FIG. 12A. The Schottky barrier diode 3 is a vertical Schottky barrier diode that has a trench MOS structure.

In FIG. 12A, the outlines of the mesa portions 112 of the semiconductor layer 11, which are located under the anode electrode 16, are indicated by broken lines, and the positions of the trench 111 and the mesa portions 112 of the semiconductor layer 11, which are located under the anode electrode 16, are indicated by their reference signs.

The Schottky barrier diode 3 includes the n-type semiconductor layer 11 formed of a gallium oxide-based semiconductor and having the trench 111 defining the mesa portions 112 on the upper surface, the high-resistance region 14 that is provided under the trench 111 of the semiconductor layer 11 and contains a p-type impurity, the insulating film 15 that is provided so as to cover at least the bottom surface among the inner surfaces of the trench 111, the anode electrode 16 that is provided on the semiconductor layer 11 through the insulating film 15 and connected to the mesa portions 112, and the cathode electrode 17 provided directly or through another layer on the lower surface of the semiconductor layer 11, in the same manner as the Schottky barrier diode 1 in the first embodiment.

The Schottky barrier diode 3 does not include the guard ring 18 and the annular protrusion 113 surrounding the mesa portions 112, in the same manner as the Schottky barrier diode 2 in the second embodiment.

In the Schottky barrier diode 3, the plane orientation of the principal surface of the semiconductor layer 11 is (001) and the length direction of the line-shaped planar pattern of the mesa portions 112 is [010] (the width direction is [100]). In this regard, when a plane orientation of a principal surface of the semiconductor substrate 10 is (001), the plane orientation of the principal surface of the semiconductor layer 11 formed thereon by epitaxial growth is also (001).

Surfaces of side portions 112$a$ of the mesa portions 112 contain nitrogen. This nitrogen on the surfaces of the side portions 112$a$ of the mesa portions 112 is the nitrogen that is implanted into the mesa portions 112, diffuse in the [100] direction, which is the width direction of the mesa portion 112, and is concentrated on the surfaces of the side portions 112$a$. Since the nitrogen concentration in inner portions 112$b$ of the mesa portions 112 is low, electrical resistance of the mesa portions 112 in the vertical direction is low and the implantation of nitrogen into the mesa portions 112 has little effect on the on-resistance of the Schottky barrier diode 2.

In addition, since the nitrogen in the mesa portions 112 has little effect on the on-resistance of the Schottky barrier diode 2, there is no need to cancel out the nitrogen in the mesa portion s112 by Si which is an n-type impurity. Therefore, the mesa portions 112 do not contain an intentionally doped n-type impurity such as Si. That is, the mesa portions 112 do not include the n-type impurity-implanted region 61 into which an n-type impurity such as Si is implanted.

To allow the nitrogen implanted into the mesa portions 112 to effectively accumulate at the surfaces of the side portions 112$a$ and reduce the nitrogen concentration in the inner portions 112$b$, the pitch width P of the mesa portions 112 arranged in a pattern of lines and spaces is preferably not more than 5 μm.

(Method for Manufacturing the Schottky Barrier Diode)

An example of a method for manufacturing the Schottky barrier diode 3 will be described below.

FIGS. 13A to 13C, 14A and 14B are explanatory vertical cross-sectional views showing a process of manufacturing the Schottky barrier diode 3 in the third embodiment of the invention. The semiconductor substrate 10 is not shown in the drawings.

Firstly, the steps up to the removal of the photoresist 52 and the $SiO_2$ film 51 shown in FIG. 8C are performed in the same manner as in the manufacturing method in the second embodiment.

Figure 13A:
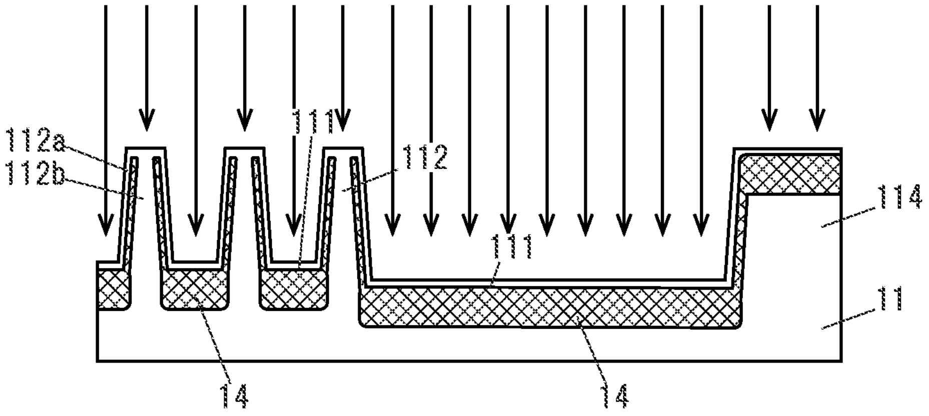
FIGS. 13A to 13C are explanatory vertical cross-sectional views showing a process of manufacturing the Schottky barrier diode in the third embodiment of the invention.

Next, as shown in FIG. 13A, the high-resistance region 14 is formed under the trench 111 by implanting nitrogen ions from above into the entire surface of the wafer and then performing annealing. At this time, nitrogen is also implanted into the upper portion of the trench 111 and the side portions 112$a$. However, since the length direction of the line-shaped planar pattern of the mesa portions 112 is [010], nitrogen is diffused to the surfaces of the side portions 112$a$ of the mesa portions 112 by annealing and the nitrogen concentration in the inner portions 112$b$ of the mesa portions 112 greatly decreases.

A dose of nitrogen ion implantation is not less than $5.0\times10^{12}$ $cm^{-2}$ and not more than $5.0\times10^{13}$ $cm^{-2}$ and implantation energy is not less than 50 keV and not more than 350 keV. In this case, an implantation depth is not less than 0.1 μm and not more than 0.5 μm, and a nitrogen concentration is not less than $5.0\times10^{17}$ $cm^{-3}$ and not more than $5.0\times10^{18}$ $cm^{-3}$. The annealing is performed at a temperature of not less than 900° C. and not more than 1100° C. in a nitrogen atmosphere or an oxygen atmosphere.

The subsequent Si implantation step can be omitted since the nitrogen concentration in the inner portions 112$b$ of the mesa portions 112 is sufficiently low and the nitrogen does not need to be canceled out by implanting an n-type impurity. Since Si implantation is not performed, the step of implanting nitrogen again to relax the electric field in the terminal end region can be also omitted.

Figure 13B:
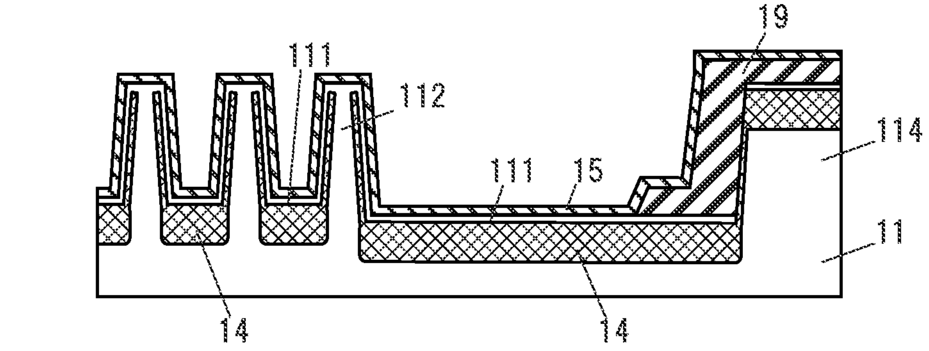

Next, as shown in FIG. 13B, a TEOS film as the field insulating film 19 and a TEOS film as the insulating film 15 are formed. The field insulating film 19 is formed to a thickness of not less than 400 nm and not more than 2000 nm by CVD and is then processed into the pattern shown in FIG. 13B by lithography and etching. The field insulating film 19 is formed so as to cover the side and upper surfaces of the portion 114 of the semiconductor layer 11 on the cuter side of the trench and the bottom surface of the trench 111 in the vicinity of the portion 114.

The insulating film 15 is formed to a thickness of not less than 50 nm and not more than 200 nm by CVD. An $Al_2O_3$ film may additionally be formed to a thickness of not less than 10 nm and not more than 30 nm on the TEOS film by ALD so that the stacked film composed of the TEOS film and the $Al_2O_3$ film is provided as the insulating film 15. In this case, the $Al_2O_3$ film acts as an etching stopper film in an etch-back step described next.

Figure 13C:
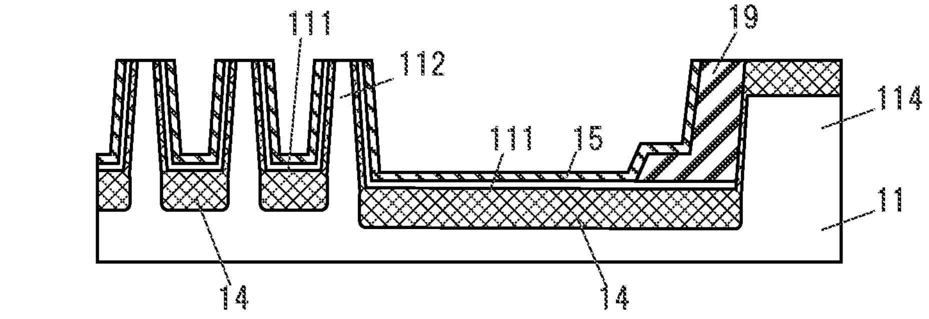

Next, as shown in FIG. 13C, the insulating film 15 on the mesa portions 112 is removed. Removal of the insulating film 15 on the mesa portions 112 is performed by resist etch-back where a resist with a thickness of not less than 2 μm and not more than 3 μm is applied to the entire surface of the wafer and etching is then performed on the entire surface.

The resist etch-back is performed by, e.g., fluorine-based dry etching using a fluorine-based etching gas such as $CF_4$ gas, and the etching is finished when the resist on the mesa portions 112 is etched. When the insulating film 15 is a single layer of TEOS film, the insulating film 15 on the mesa portions 112 is also etched at this time. When the insulating film 15 is a stacked film composed of a TEOS film and an $Al_2O_3$ film, the $Al_2O_3$ film acts as an etching stopper, hence, e.g., the $Al_2O_3$ film is etched with an alkaline solution such as TMAH solution and the TEOS film thereunder is etched with a chemical solution containing fluorine, such as hydrofluoric acid. After removing the insulating film 15 on the mesa portions 112, the remaining resist is removed. After that, heat treatment at a temperature of not less than 400° C. and not more than 500° C. is performed as annealing for etching damage recovery.

Figure 14A:
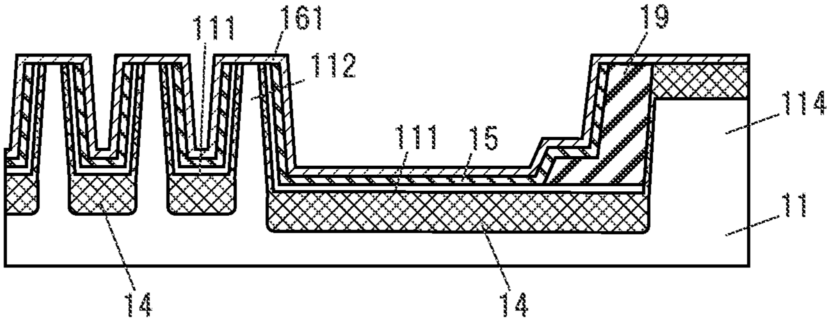
FIGS. 14A and 14B are explanatory vertical cross-sectional views showing the process of manufacturing the Schottky barrier diode in the third embodiment of the invention.

Next, after cleaning the wafer with a mixture solution of pure water, hydrogen peroxide and sulfuric acid, a stacked film composed of a Mo film, a Ni film and an Au film, etc., is formed to a thickness of not less than 50 nm and not more than 500 nm as the first layer 161 of the anode electrode 16 by vapor deposition, as shown in FIG. 14A.

Figure 14B:
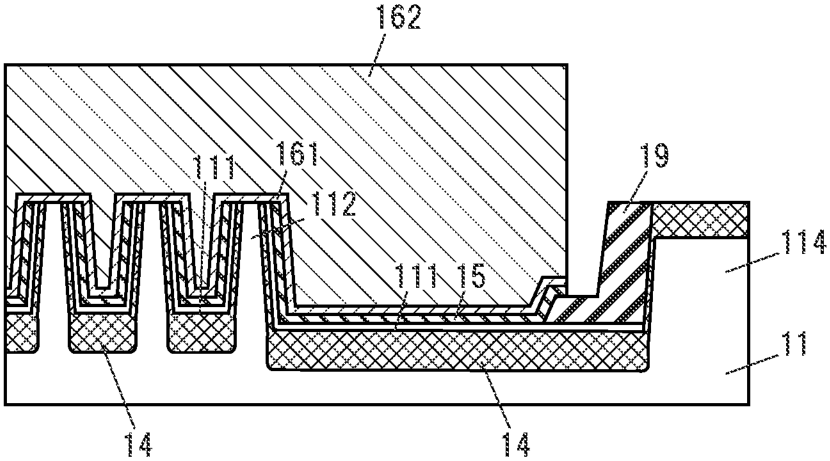

Next, as shown in FIG. 14B, the second layer 162 composed of an Al film is formed on the first layer 161. The Al film is formed to a thickness of not less than 0.5 μm and not more than 3 μm by sputtering. Before forming the Al film, a Ti film may be formed as an adhesion layer by sputtering. The Al film may be formed at a high temperature of 300 to 450° C. so that the Al film is completely embedded in the regions of the trench 111 between the mesa portions 112. After that, the first layer 161 and the second layer 162 are processed into the pattern shown in FIG. 14B by lithography and etching.

Subsequently, after protecting the wafer front surface with a resist, the TEOS film formed on the wafer back surface, i.e., the lower surface of the semiconductor substrate 10, is removed using, e.g., a chemical solution containing fluorine, such as hydrofluoric acid. Then, after removing the resist, a stacked film composed of a Ti film and an Au film is formed as the cathode electrode 17 on the lower surface of the semiconductor substrate 10. A Ni film or a Mo film may be provided as a barrier metal between the Ti film and the Au film. When a stacked film composed of a TEOS film and an $Al_2O_3$ film is used as the insulating film 15, the insulating film removal step before forming the cathode electrode 17 can be omitted since the insulating film formed on the wafer back surface has already been removed by wet etching in the resist etch-back step described above.

Fourth Embodiment

The fourth embodiment of the invention differs from the third embodiment in that the Schottky barrier diode has a junction-barrier Schottky (JBS) structure. Hereinafter, descriptions of the same features as in the first to third embodiments will be omitted or simplified.

(Configuration of the Schottky Barrier Diode)

Figure 15A:
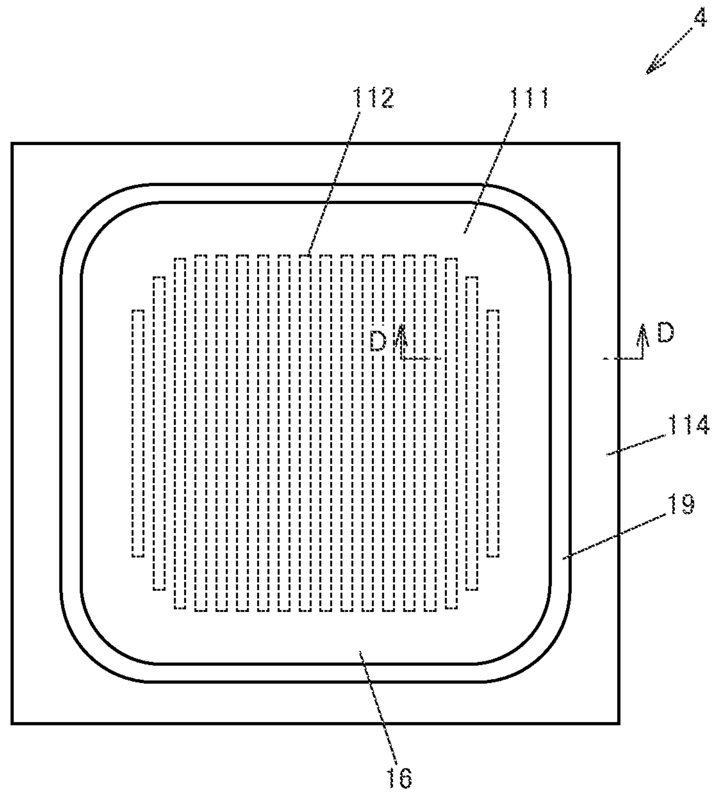
FIG. 15A is a top view showing a Schottky barrier diode in the fourth embodiment of the invention.
Figure 15B:
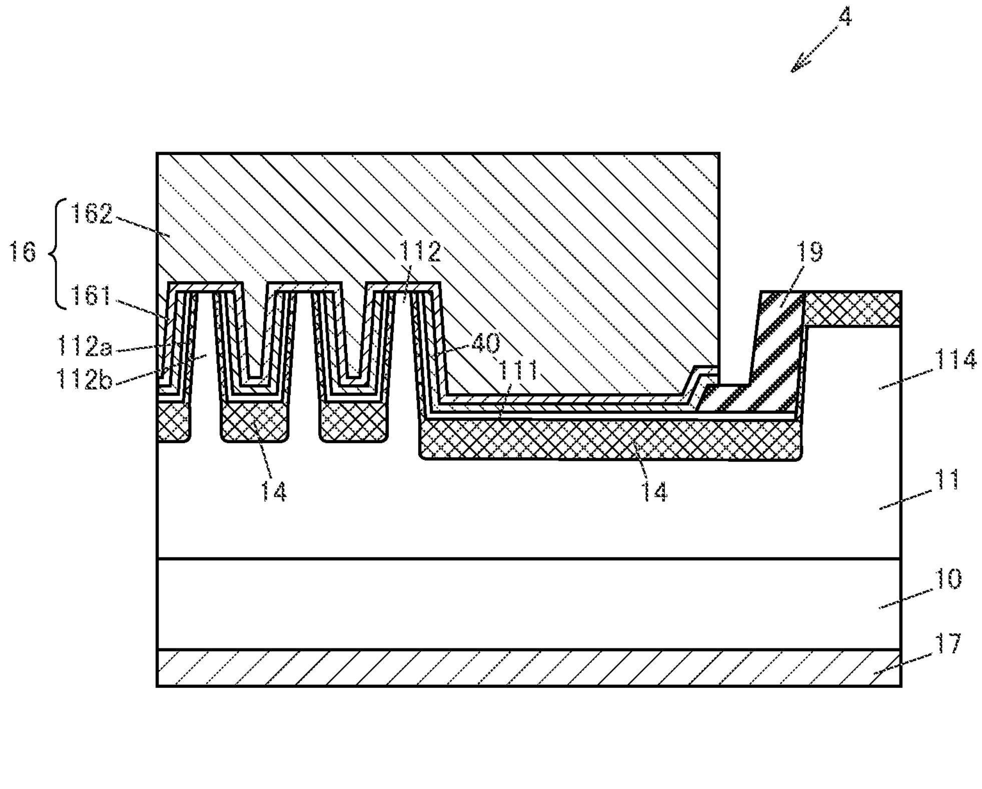
FIG. 15B is a vertical cross-sectional view showing the Schottky barrier diode taken along a line D-D shown in FIG. 15A.

FIG. 15A is a top view showing a Schottky barrier diode 4 in the fourth embodiment of the invention. FIG. 15B is a vertical cross-sectional view showing the Schottky barrier diode 4 taken along the line D-D shown in FIG. 15A. The Schottky barrier diode 4 is a vertical Schottky barrier diode that has a trench structure.

In FIG. 15A, the outlines of the mesa portions 112 of the semiconductor layer 11, which are located under the anode electrode 16, are indicated by broken lines, and the positions of the trench 111 and the mesa portions 112 of the semiconductor layer 11, which are located under the anode electrode 16, are indicated by their reference signs.

The Schottky barrier diode 4 includes the n-type semiconductor layer 11 formed of a gallium oxide-based semiconductor and having the trench 111 defining the mesa portions 112 on the upper surface, the high-resistance region 14 that is provided under the trench 111 of the semiconductor layer 11 and contains a p-type impurity, a p-type semiconductor film 40 that is provided so as to cover at least the bottom surface among the inner surfaces of the trench 111, the anode electrode 16 that is provided on the semiconductor layer 11 through the p-type semiconductor film 40 and connected to the mesa portions 112, and the cathode electrode 17 provided directly or through another layer on the lower surface of the semiconductor layer 11.

The Schottky barrier diode 4 in the fourth embodiment of the invention is a Schottky barrier diode with a JBS structure which includes the p-type semiconductor film 40 formed of NiO, $Cu_2O$ or CuO, etc., in place of the insulating film 15 in the Schottky barrier diode 3 in the third embodiment. The Schottky barrier diode 4 may be also a Schottky barrier diode with a JBS structure which includes the p-type semiconductor film 40 in place of the insulating film 15 in the Schottky barrier diode 1 in the first embodiment or the Schottky barrier diode 2 in the second embodiment.

The p-type semiconductor film 40 can be formed by sputtering. The p-type semiconductor film 40 has a similar shape to the insulating film 15 and is removed from the top of the mesa portions 112, etc., by etch-back in the same manner as the insulating film 15. When the p-type semiconductor film 40 is formed of $Cu_2O$ or CuO, the p-type semiconductor film 40 can be wet etched using an acidic solution such as buffered hydrofluoric acid solution, diluted aqua regia, or dilute sulfuric acid. When the p-type semiconductor film 40 is formed of NiO, the p-type semiconductor film 40 can be dry etched using an etching gas containing chlorine, such as $BCl_3$.

In the Schottky barrier diode 4, a p-n diode formed by the p-type semiconductor film 40 and the n-type semiconductor layer 11 is formed on the bottom surface of the trench 111 outside the mesa portions 112, which provides high surge current resistance.

Effects of the Embodiments

In the first to fourth embodiments, by providing the high-resistance region under the trench of the semiconductor layer, it is possible to provide a Schottky barrier diode with a trench MOS structure that has an even higher withstand voltage than the known art.

In the first to thins embodiments, the high-resistance region 14 may be formed using Mg instead of nitrogen. The conditions for Mg ion implantation are similar to the conditions for nitrogen ion implantation, and are a dose of not less than $5.0\times10^{12}$ $cm^{-2}$ and not more than $5.0\times10^{13}$ $cm^{-2}$ and implantation energy of not less than 100 keV and not more than 500 keV. In this case, a depth of the high-resistance region 14 is not less than 0.1 μm and not more than 0.5 μm, and a concentration is not less than $5.0\times10^{17}$ $cm^{-3}$ and not more than $5.0\times10^{18}$ $cm^{-3}$. To effectively exert the electric field relaxation effect of the high-resistance region 14, it is preferable to satisfy a relationship $W\times N_d<D\times N_a$, where W is a width of a depletion layer formed in the semiconductor layer 11 from the bottom surface of the trench 111 in the depth direction when a reverse voltage is applied, $N_d$ is a donor concentration in the high-resistance region 14, D is a depth of the high-resistance region 14 from the bottom surface of the trench 111, and $N_a$ is an acceptor concentration in the high-resistance region 14. However, nitrogen diffuses less by annealing after implantation than Mg and allows the high-resistance region 14 to maintain high resistance more easily. In addition, when the plane orientation of the principal surface of the semiconductor layer 11 is (001) and the length direction of the line-shaped planar pattern of the mesa portions 112 is [010] (the width direction is [100]), nitrogen implanted into the mesa portions 112 effectively diffuses to the surfaces of the side portions and this results in a significant decrease in the nitrogen concentration inside the mesa portions 112 as described above, but the same effect is not obtained when Mg is used instead of nitrogen.

In addition, an $HfO_2$ film, a $ZrO_2$ film, a $Y_2O_3$ film, a $Si_3N_4$ film, or a stacked film composed of not less than two of these films may be used in place of the $Al_2O_3$ film used for the insulating film 15 in the first to third embodiments.

In addition, although a gallium oxide-based semiconductor is used as the material for the semiconductor substrate 10 and the semiconductor layer 11 of the Schottky barrier diodes 1 to 4 in the first to fourth embodiments, a wide-bandgap semiconductor other than the gallium oxide-based semiconductor, such as SiC, may also be used. The wide-bandgap semiconductor here means a semiconductor having a bandgap of not less than 3.0 eV. In addition, the n-type impurity and the p-type impurity used in the semiconductor substrate 10 and the semiconductor layer 11 are appropriately selected and used according to the material of the semiconductor layer 11. In addition, the conductivity types (n-type and p-type) of the doped impurities and the members of the Schottky barrier diodes 1 to 4 may be reversed.

That is, according to an aspect of the invention, it is possible to provide the following Schottky barrier diodes.

(1) A Schottky barrier diode, comprising: a semiconductor layer of a first conductivity type comprising a wide-bandgap semiconductor and comprising a trench defining a mesa portion on a first surface; a high-resistance region that is provided under the trench of the semiconductor layer and comprises an impurity of a second conductivity type different from the first conductivity type; an insulating film, or a semiconductor film of the second conductivity type, that is provided so as to cover at least a bottom surface among inner surfaces of the trench; an anode electrode provided on the semiconductor layer through the insulating film or the semiconductor film and connected to the mesa portion; and a cathode electrode provided directly or through another layer on a second surface of the semiconductor layer on the opposite side to the first surface.

(2) The Schottky barrier diode defined in (1), wherein a relationship $W\times N_d<D\times N_a$ is satisfied, where W is a width of a depletion layer formed in the semiconductor layer from the bottom surface of the trench in a depth direction when a reverse voltage is applied, $N_d$ is a donor concentration in the high-resistance region, D is a depth of the high-resistance region from the bottom surface of the trench, and $N_a$ is an acceptor concentration in the high-resistance region.

(3) The Schottky barrier diode defined in (1) or (2), wherein the wide-bandgap semiconductor comprises a gallium oxide-based semiconductor, and wherein the first conductivity type and the second conductivity type are respectively n-type and p-type.

(4) The Schottky barrier diode defined in (3), wherein the impurity of the second conductivity type comprises nitrogen.

(5) The Schottky barrier diode defined in (1) or (2), wherein the trench defines the mesa portion and an annular protrusion surrounding the mesa portion, and wherein an annular guard ring of the second conductivity type is provided on the protrusion.

(6) The Schottky barrier diode defined in (4), wherein a plane orientation of a principal surface of the semiconductor layer is (001), wherein the mesa portion comprises a line-shaped planar pattern with a length direction along [010], and wherein a surface of a side portion of the mesa portion comprises the impurity of the second conductivity type.

(7) The Schottky barrier diode defined in (6), wherein the mesa portion does not comprise an intentionally doped impurity of the first conductivity type.

Although the embodiments of the invention have been described, the invention is not intended to be limited to the embodiments, and the various kinds of modifications can be implemented without departing from the gist of the invention. In addition, the constituent elements in the embodiments can be arbitrarily combined without departing from the gist of the invention. In addition, the invention according to claims is not to be limited to the embodiments described above. Further, it should be noted that not all combinations of the features described in the embodiments are necessary to solve the problem of the invention.

REFERENCE SIGNS LIST

1, 2, 3 SCHOTTKY DIODE
10 n-TYPE SEMICONDUCTOR SUBSTRATE
11 SEMICONDUCTOR LAYER
111 TRENCH
112 MESA PORTION
113 PROTRUSION
14 HIGH-RESISTANCE REGION
15 INSULATING FILM
16 ANODE ELECTRODE
17 CATHODE ELECTRODE
18 GUARD RING
40 p-TYPE SEMICONDUCTOR FILM
61 n-TYPE IMPURITY-IMPLANTED REGION

The invention claimed is:

1. A Schottky barrier diode, comprising:

a semiconductor layer of a first conductivity type comprising a wide-bandgap semiconductor and a trench defining a mesa portion on a first surface thereof;

a high-resistance region under the trench of the semiconductor layer, the high-resistance region comprising an impurity of a second conductivity type different from the first conductivity type;

an insulating film or a semiconductor film of the second conductivity type, the insulating film or semiconductor film covering at least a bottom surface among inner surfaces of the trench;

an anode electrode on the semiconductor layer through the insulating film or the semiconductor film, the anode electrode being connected to the mesa portion; and a cathode electrode directly or through another layer on a second surface of the semiconductor layer on the opposite side to the first surface, wherein a relationship $W \times N_d < D \times N_a$ is satisfied, where W is a width of a depletion layer formed in the semiconductor layer from the bottom surface of the trench in a depth direction when a reverse voltage is applied, $N_d$ is a donor concentration in the high-resistance region, D is a depth of the high-resistance region from the bottom surface of the trench, and $N_d$ is an acceptor concentration in the high-resistance region.

2. The Schottky barrier diode according to claim 1, wherein the trench defines an annular protrusion surrounding a periphery of the mesa portion, and wherein an annular guard ring of the second conductivity type is provided on the protrusion.

3. The Schottky barrier diode according to claim 1, wherein the wide-bandgap semiconductor comprises a gallium oxide-based semiconductor, and wherein the first conductivity type and the second conductivity type are n-type and p-type, respectively.

4. The Schottky barrier diode according to claim 3, wherein the impurity of the second conductivity type comprises nitrogen.

5. The Schottky barrier diode according to claim 4, wherein a plane orientation of a principal surface of the semiconductor layer is (001), wherein the mesa portion comprises a line-shaped planar pattern with a length direction along [010], and wherein a surface of a side portion of the mesa portion comprises the impurity of the second conductivity type.

6. The Schottky barrier diode according to claim 5, wherein the mesa portion does not comprise an intentionally doped impurity of the first conductivity type.

* * * * *